(12) United States Patent
Hossain et al.

(10) Patent No.: US 10,348,480 B2
(45) Date of Patent: Jul. 9, 2019

(54) COLLABORATIVE CLOCK AND DATA RECOVERY

(71) Applicant: Rambus Inc., Sunnyvale, CA (US)

(72) Inventors: Masum Hossain, Edmonton (CA);
Nhat Nguyen, San Jose, CA (US);
Yikui Jen Dong, Cupertino, CA (US);
Arash Zargaran-Yazd, Sunnyvale, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 15/799,016

(22) Filed: Oct. 31, 2017

(65) Prior Publication Data

US 2018/0152284 A1 May 31, 2018

Related U.S. Application Data

(63) Continuation of application No. 15/212,514, filed on Jul. 18, 2016, now Pat. No. 9,832,009.

(60) Provisional application No. 62/235,140, filed on Sep. 30, 2015, provisional application No. 62/198,083, filed on Jul. 28, 2015.

(51) Int. Cl.
*H04L 7/00* (2006.01)
*H04L 25/49* (2006.01)
*H03K 7/02* (2006.01)
*H03L 7/00* (2006.01)
*H04L 7/033* (2006.01)

(52) U.S. Cl.
CPC ............ *H04L 7/0087* (2013.01); *H03K 7/02* (2013.01); *H03L 7/00* (2013.01); *H04L 7/0025* (2013.01); *H04L 7/0337* (2013.01); *H04L 25/4917* (2013.01)

(58) Field of Classification Search
CPC . H04L 7/0087; H04L 7/0337; H04L 25/4917; H04L 7/0025; H03L 7/00; H03K 7/02
See application file for complete search history.

(56) References Cited

U.S. PATENT DOCUMENTS

| 7,092,472 | B2 | 8/2006 | Stojanovic |
| 7,443,941 | B2 | 10/2008 | Farjad-rad |
| 8,331,512 | B2 | 12/2012 | Lee et al. |
| 8,548,110 | B2 * | 10/2013 | Lin ..................... H04L 7/0025 375/355 |

(Continued)

*Primary Examiner* — Jean B Corrielus
(74) *Attorney, Agent, or Firm* — The Neudeck Law Firm, LLC

(57) ABSTRACT

A receiver serial data streams generates a local timing reference clock from an approximate frequency reference clock by phase-aligning the local clock to transitions in the data stream. This process is commonly known as clock and data recovery (CDR). Certain transitions of the data signals are selected for use in phase-aligning the local clock, and certain transitions are ignored. Phase-error signals from multiple receivers receiving the multiple serial data streams are combined and used to make common phase adjustments to the frequency reference clock. These common adjustments track jitter that is common to the received data streams. Local adjustments that better align each respective local clock to the transitions of its respective serial data stream are made using a local phase-error signal. These local adjustments track jitter that is more unique to each of the respective serial data streams.

20 Claims, 15 Drawing Sheets

(56) References Cited

U.S. PATENT DOCUMENTS

| | | | |
|---|---|---|---|
| 8,711,996 B2 | 4/2014 | Chang | |
| 9,049,075 B2* | 6/2015 | Juenemann | H04L 25/03057 |
| 9,184,909 B1* | 11/2015 | McCracken | H04L 7/042 |
| 9,455,825 B2* | 9/2016 | Lin | H04L 7/0025 |
| 2005/0134305 A1* | 6/2005 | Stojanovic | H04L 25/028 |
| | | | 326/31 |
| 2005/0201491 A1* | 9/2005 | Wei | H04L 7/0337 |
| | | | 375/326 |
| 2006/0062341 A1* | 3/2006 | Edmondson | H03L 7/0814 |
| | | | 375/376 |
| 2006/0140321 A1* | 6/2006 | Tell | H03L 7/0814 |
| | | | 375/376 |
| 2006/0224339 A1 | 10/2006 | Kim et al. | |
| 2006/0233291 A1* | 10/2006 | Garlepp | H04L 25/063 |
| | | | 375/355 |
| 2009/0237138 A1 | 9/2009 | Shanbhag et al. | |
| 2009/0243681 A1* | 10/2009 | Zerbe | H04L 7/0066 |
| | | | 327/163 |
| 2010/0322367 A1* | 12/2010 | Wenske | H03L 7/0807 |
| | | | 375/373 |
| 2011/0068840 A1 | 3/2011 | Williams et al. | |
| 2011/0194659 A1* | 8/2011 | Kenney | H03L 7/0807 |
| | | | 375/355 |
| 2012/0235720 A1* | 9/2012 | Jiang | H04L 7/0332 |
| | | | 327/158 |
| 2013/0003907 A1* | 1/2013 | Wenske | H04L 7/033 |
| | | | 375/373 |
| 2015/0078495 A1 | 3/2015 | Hossain et al. | |
| 2015/0092898 A1 | 4/2015 | Lee et al. | |
| 2015/0162922 A1* | 6/2015 | Song | H04L 7/0091 |
| | | | 375/376 |
| 2016/0301548 A1 | 10/2016 | Musah et al. | |

* cited by examiner

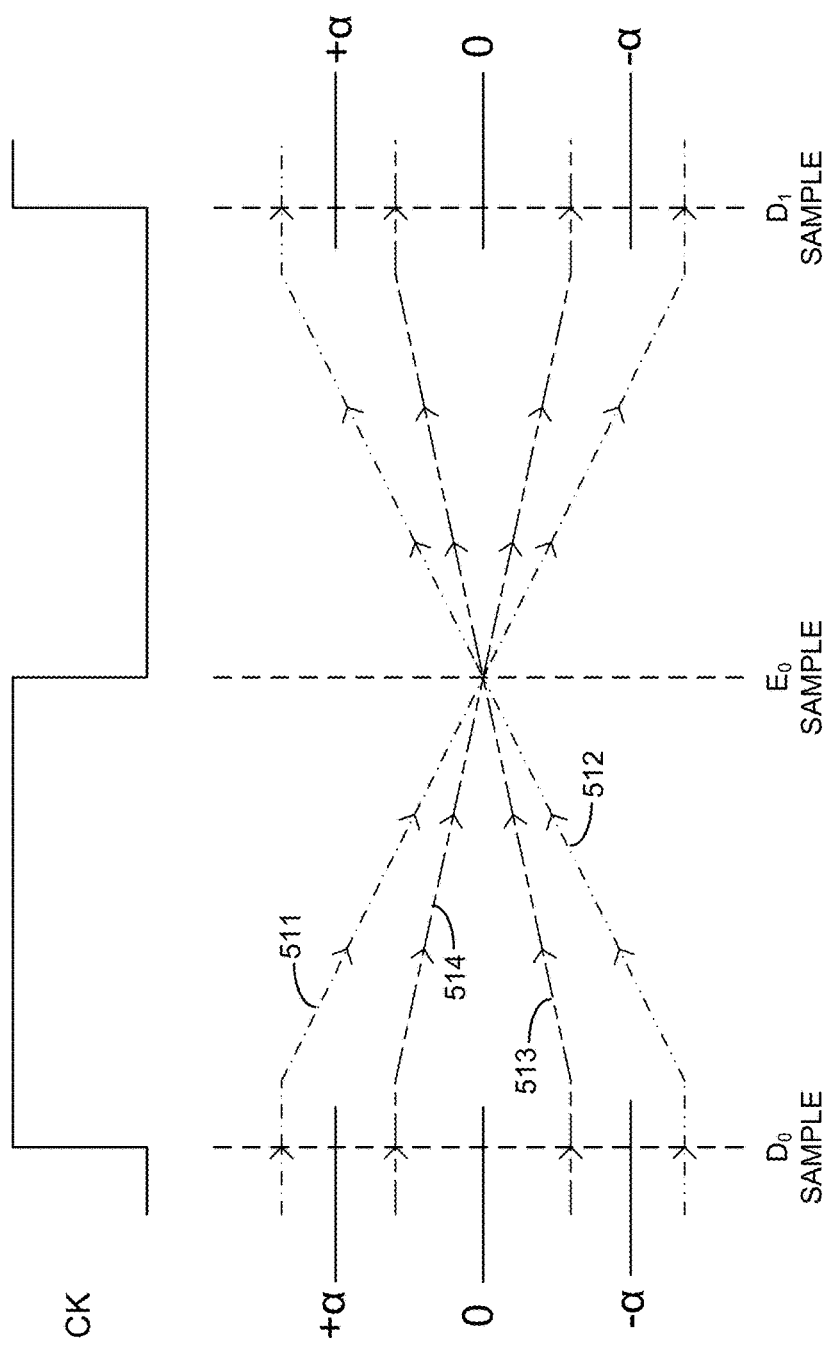

US 10,348,480 B2

COLLABORATIVE CLOCK AND DATA RECOVERY

RELATED APPLICATIONS

This application is a continuation of Ser. No. 15/212,514, now U.S. Pat. No. 9,832,009, filed Jul. 18, 2016, and claims the benefit of U.S. Provisional Application No. 62/198,083, filed on Jul. 28, 2015, and also claims the benefit of U.S. Provisional Application No. 62/235,140, filed Sep. 30, 2015, all of which are hereby incorporated by reference for all purposes.

BRIEF DESCRIPTION OF THE SEVERAL VIEWS OF THE DRAWINGS

FIGS. 5A, 5B, and 5C are diagrams illustrating properties of example 4-level pulse-amplitude modulation (PAM-4) transitions.

DETAILED DESCRIPTION OF THE EMBODIMENTS

Various embodiments described herein relate to a system including integrated circuit devices. These integrated circuit devices include, for example, memory devices and/or at least a memory controller device that controls such memory devices (and methods of operation of these respective devices). In several embodiments, as is described in more detail below, integrated circuit devices communicate information (e.g., commands and addresses, and/or data) by driving/transmitting signals on interconnects between devices. The circuits used to send these signals may be referred to as drivers, transmitter, and/or output circuits. The circuits used to send receive these signals may be referred to as receivers, and/or input circuits.

An integrated circuit may communicate with another integrated circuit using multiple high-speed serial data streams that are sent without an accompanying clock signal, but whose transmission/transition times are controlled using the same transmit clock. The receiver of each of these data streams generates a local timing reference clock from an approximate frequency reference clock by phase-aligning the frequency reference clock (a.k.a., receiver reference clock, or receiver clock) to transitions in the data stream. This process is commonly known as clock and data recovery (CDR).

In an embodiment, certain transitions of the data signals are selected for use in phase-aligning the local clock, and certain transitions are ignored. In addition, phase-error signals from multiple receivers receiving the multiple serial data streams are combined and used to make common phase adjustments to the frequency reference clock. These common adjustments reflect the phase-error component that appears across multiple receivers. The common adjustments are typically done at a faster (i.e., more often) rate to track high-frequency jitter that is common to the received data streams. Local adjustments that better align each respective local clock to its respective serial data stream are made using a local phase-error signal. These local adjustments track jitter that is more specific to each of the respective serial data streams.

Figure 1:
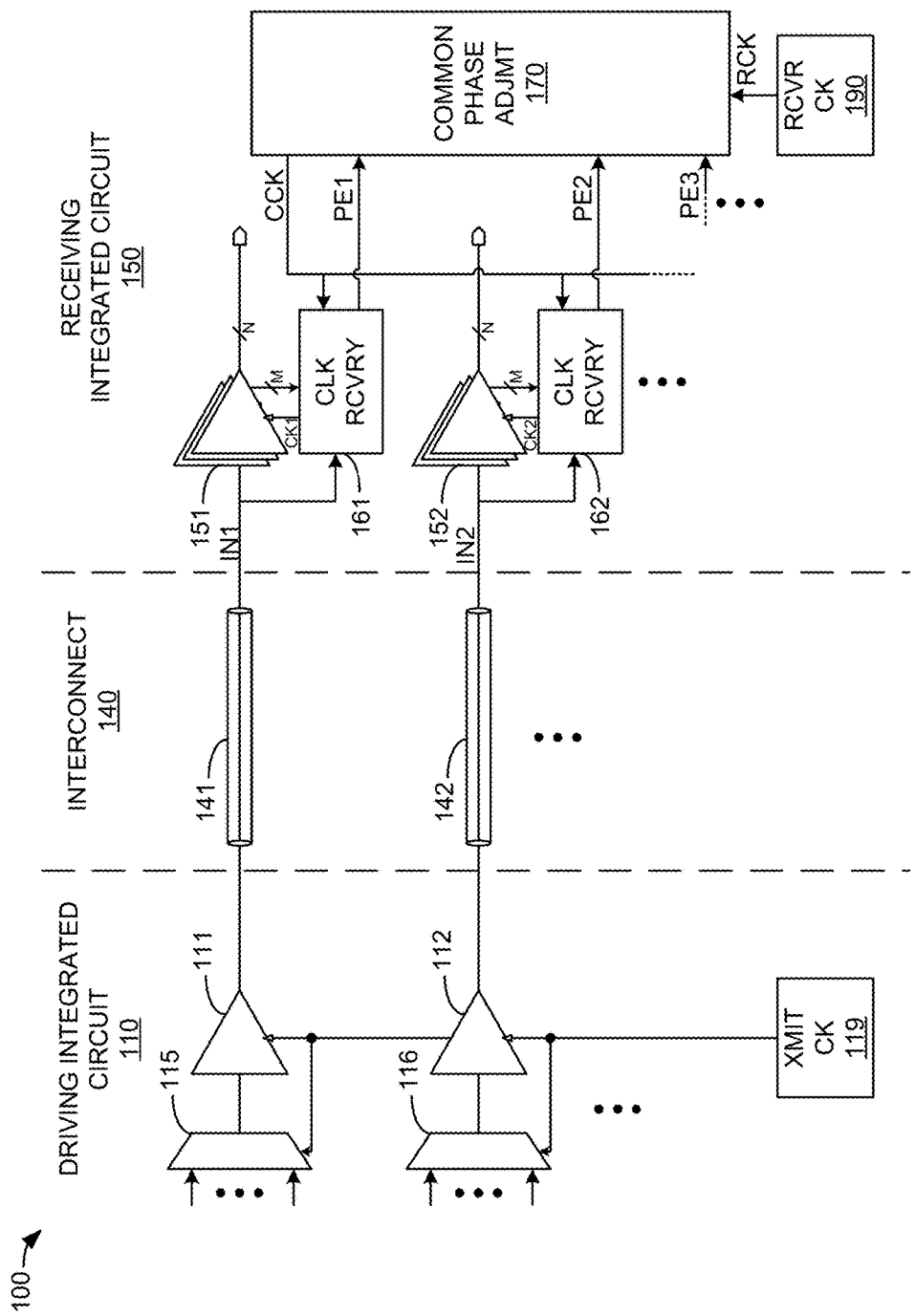
FIG. 1 is a block diagram illustrating a communication system with multi-channel collaborative clock and data recovery.

FIG. 1 is a block diagram illustrating a communication system with multi-channel collaborative clock and data recovery. In FIG. 1, communication system 100 comprises a driving integrated circuit 110, a receiving integrated circuit 150, and interconnect 140 between them. Driving integrated circuit 110 includes transmitter circuits 111-112 (a.k.a., drivers), transmit clock source 119, and serializers 115-116. Receiving integrated circuit 150 includes data sampler circuits 151-152 (a.k.a., data samplers), clock recovery circuits 161-162, common phase adjustment circuit 170, and receive clock source 190. Interconnect 140 between driving integrated circuit 110 and receiving integrated circuit 150 comprises interconnects 141-142. Interconnect 140 (and interconnects 141-142, in particular) typically comprises a printed circuit (PC) board, connector, cable, flex circuit, other substrate, and/or a combination of these. Interconnect 140 may be and/or include one or more transmission lines. It should also be understood that although system 100 is illustrated as transmitting a single-ended signal, the signals sent by the driving integrated circuit 110 of system 100 may represent one of a pair of differential signals.

Driving integrated circuit 110 comprises a plurality of transmitter circuits 111-112. Transmitter circuit 111 is operatively coupled to serializer 115 to receive serialized data. Transmitter circuit 111 and serializer 115 are operatively coupled to transmit clock source 119. Transmitter circuit 111 is operatively coupled to transmit clock source 119 to receive at least one timing reference signal that determines when serialized data received by transmitter circuit 111 from serializer 115 is output by transmitter circuit 111. Likewise, Transmitter circuit 112 is operatively coupled to serializer 116 to receive serialized data. Transmitter circuit 112 and serializer 116 are operatively coupled to transmit clock source 119. Transmitter circuit 112 is operatively coupled to transmit clock source 119 to receive at least one timing reference signal that determines when serialized data received by transmitter circuit 112 from serializer 116 is output by transmitter circuit 112. Thus, a common transmit clock signal controls the timing of the data transitions output by transmitter circuit 111 and transmitter circuit 112.

The output of transmitter circuit 111 is coupled to the data inputs of data samplers 151 and the data input of clock recovery 161 via interconnect 141. The output of transmitter circuit 112 is coupled to the data inputs of data samplers 152 and the data input of clock recovery 162 via interconnect 142. Data samplers 151 receive a sample clock (CK1) from clock recovery 161. Data samplers 151 sample (or resolve) the voltage level at their data input (i.e., from interconnect 141) against a respective plurality of threshold voltages (e.g., PAM-4 compatible threshold voltages of $-\alpha$, 0, and $+\alpha$ for M=3) according to timing provided by sample clock CK1. Data samplers 152 receive a sample clock (CK2) from clock recovery 162. Data samplers 152 sample (or resolve) the voltage level at their data input (i.e., from interconnect 142) against a respective plurality of threshold voltages according to timing provided by sample clock CK2.

The M outputs from data samplers 151-152 are decoded to produce N number of received bits. For example, for PAM-4 communication system, three (3) data samplers (i.e., M=3) are used to compare the input voltage to three threshold voltages ($-\alpha$, 0, and $+\alpha$). These three outputs are decoded to produce a two (2) bit output (i.e., N=2). In another example, for PAM-2 communication system, one (1) data sampler (i.e., M=1) can be used to compare the input voltage to a single threshold voltage (e.g., 0). This output corresponds to a one (1) bit output (i.e., N=1).

In an embodiment, data samplers 151 and data samplers 152 are configured to use the same plurality of threshold voltages. In another embodiment, data samplers 151 and data samplers 152 may use different sets threshold voltages, and/or different numbers of threshold voltages. However, for the sake of brevity, this discussion will assume that data samplers 151 and data samplers 152 are configured to use the same plurality of threshold voltages.

In other words, for example, in response to one of the edges on CK1 (e.g., rising edge) a particular sampler 151 determines whether the voltage at that sampler 151's input is greater than, or less than, a particular threshold (e.g., 1.0V, 0.0V, or $+\alpha$ volts) The output of that sampler corresponds to whether the voltage at the input to that sampler is greater than, or less than, the threshold.

In FIG. 1, there are M number of data samplers 151-152. Thus, the number of outputs from data samplers 151-152 is M signals respectively indicating whether the voltage at the inputs of these M samplers 151-152 is greater than, or less than, the corresponding M number of threshold voltages. These M signals are provided to clock recovery 161 and clock recovery 162, respectively. Accordingly, data samplers 162 also provide a respective M number of signals to clock recovery 162.

Receiving integrated circuit 150 also includes receiver clock source 190. Receiver clock source 190 is operatively coupled to common phase adjustment 170. Common phase adjustment 170 receives a clock signal (RCK) from receiver clock source 190. Common phase adjustment 170 changes the phase of clock signal RCK to produce phase-adjusted clock signal CCK.

Common phase adjustment 170 provides a phase-adjusted clock signal CCK to clock recovery circuits 161-162 of receiving integrated circuit 150. Each of clock recovery circuits 161-162 provides a corresponding phase-error signal (PE1, PE2, etc.) to common phase adjustment 170. The amount of phase change that common phase adjustment 170 applies to clock signal RCK to produce phase-adjusted clock signal CCK is based on the phase-error signals from multiple clock recovery circuits 161-162.

In this manner, multiple clock recovery circuits 161-162 (and therefore multiple data channels 141-142) collaborate to commonly phase adjust clock signal CCK which is provided to clock recovery circuits 161-162 for further (e.g., local) adjustment by respective clock recovery circuits 161-162. After this further adjustment, clock recovery circuits 161-162 provide respective clock signals (CK1, CK2, etc.) to respective data samplers 151-152 as a timing reference for sampling.

In an embodiment, the phase resolution of both the common phase adjustment feedback loop (i.e., common phase adjustment 170, CCK, clock recovery circuits 161-162, and phase error signals PE1, PE2, etc.) and the local phase adjustment loops (i.e., the feedback loops between respective clock recovery circuits 161-162 and their respective clock signals CK1, CK2, etc.) are the same. In another embodiment, the common phase adjustment loop has greater resolution than the local phase adjustment loops. In an embodiment, the common phase adjustment loop has a faster update time the local phase adjustment loops.

Figure 2:
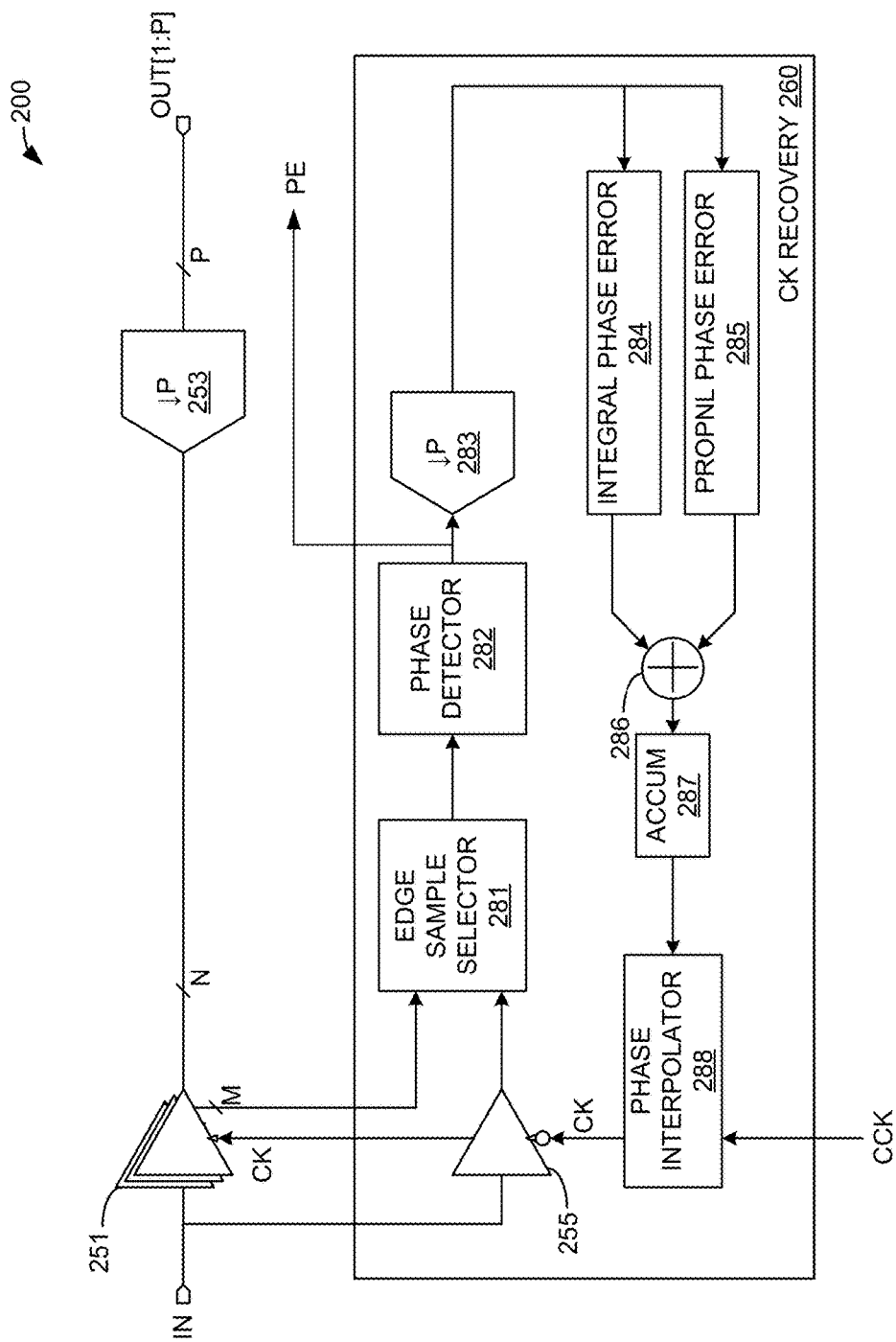
FIG. 2 is a block diagram of a receiver with collaborative clock and data recovery.

FIG. 2 is a block diagram of receiver with collaborative clock and data recovery. In FIG. 2, receiver 200 comprises data samplers 251, clock recovery 260, and deserializer 253. The data input signal (IN) is coupled to the data inputs of M number of data samplers 251. Data samplers 251 provide M number of outputs to clock recovery 260. Clock recovery 260 provides an adjusted timing reference (CK) to the timing reference input (e.g., sample clock input) of data samplers 251. After decoding (if necessary), data samplers 251 provide N bits of received data (corresponding to the digital value(s) received from the data input signal, IN) to deserializer 253. Deserializer 253 outputs P bits of data as the output data signal(s) OUT[1:P]. Clock recovery 260 receives a commonly adjusted clock signal CCK. Clock recovery also outputs a phase error signal (PE). Thus, it should be understood that data samplers 251 can correspond in function and structure to data samplers 151 and/or data samplers 152 of FIG. 1. Likewise, it should be understood that clock recovery 260 can correspond function and structure to clock recovery circuit 161 and/or clock recovery circuit 162 of FIG. 1.

Clock recovery 260 comprises edge sampler 255, edge sample selector 281, phase detector 282, decimator/deserializer 283, integral phase error circuit 284, proportional phase error circuit 285; summation combiner 286 (a.k.a., summer and/or sum), accumulator 287, and phase interpolator 288. Data input signal IN is coupled to the data input of edge sampler 255. Edge sampler 255 samples in response to adjusted timing reference CK. Edge sampler 255, however, is configured to sample the data input signal IN on the opposite clock edge as data samplers 251. Thus, edge sampler 255 is configured to sample the data input signal IN at approximately the midpoint in time between samples taken by samplers 251. In this manner, edge sampler 255 will sample the data input signal IN at a point in time when data input signal IN may be transitioning between two voltage levels.

It should be understood that a configuration where edge sampler 255 samples the data input signal IN on the opposite clock edge as data samplers 251 is for a baud rate system. For a half-rate system, edge sampler 255 would be configured to sample the data input signal IN 90° from the edge used to time the data samples.

The output of edge sampler 255 is input to edge sample selector 281. Edge sample selector 281 also receives the M outputs of data samplers 251. Based on the values of the M outputs of data samplers 251, edge sample selector 281 determines whether to allow the output of edge sampler 255 to be used by phase detector 282. In other words, the samples taken by edge sampler 255 are either used by phase detector 282, or discarded. The decision of whether to use a particular sample taken by edge sampler 255 is based on the values output by data samplers 251. In this manner, certain samples taken during the transitions of the data input signal (as taken by edge sampler 255) can be ignored (or rejected), and certain samples used (or selected). In particular, the ignored samples can correspond to data input signal IN transitions that cross the threshold voltage of edge sampler 255 at times that do not (when CK is correctly phase adjusted) correspond to the timing of the sampling edge of CK used by edge sampler 255. The selected (i.e., used) samples can correspond to data input signal IN transitions that cross the threshold voltage of edge sampler 255 at times that (when CK is correctly phase adjusted) correspond to the timing of the sampling edge of CK used by edge sampler 255.

The samples selected by edge sample selector 281 are used by phase detector 282 to produce a phase error signal, PE. After down-sampling by decimator/deserializer 283, a down-sampled phase error signal is provided to integral phase error circuit 284 and proportional phase error circuit 285. Proportional phase error circuit 285 applies a proportional loop gain factor ($K_p$) to the input phase error signal, PE. The output of phase error circuit 285 corresponds to a scaled version of PE. This scaled version of PE is provided by proportional phase error circuit 285 to a first input of summing combiner 286. Integral phase error circuit 284 accumulates phase error signal PE and applies an integral loop gain factor ($K_i$) to the accumulated phase error signal. The output of integral phase error circuit 284 is provided by integral phase error circuit 284 to a second input of summing combiner 286. Summing combiner 286 sums the two inputs and provides a summed output to accumulator 287. Accumulator 287 accumulates the summed output from summer 286 and provides a control input to phase interpolator 288. This control input to phase interpolator 288 adjusts the phase of CCK, by an amount controlled by the output from accumulator 287, to produce adjusted timing reference CK.

It should be understood that the operation of clock recovery 260 can be described in terms of a feedback loop that operates similar to a delay-locked loop feedback system. A feedback signal (i.e., CK) is compared by edge sampler 255 to a reference signal (i.e., transitions on the input signal IN). Selected results of this comparison (e.g., selected by edge sample selector 281) are used to produce a phase-error signal (i.e., PE). The phase-error signal (or a downsampled version thereof) is passed through a loop filter (i.e., integral phase error 284, proportional phase error 285, summer 286, and accumulator 287) to provide a control input to a phase interpolator 288 that adjusts the phase of CCK to produce the feedback signal (CK) that completes the feedback loop.

Figure 3:
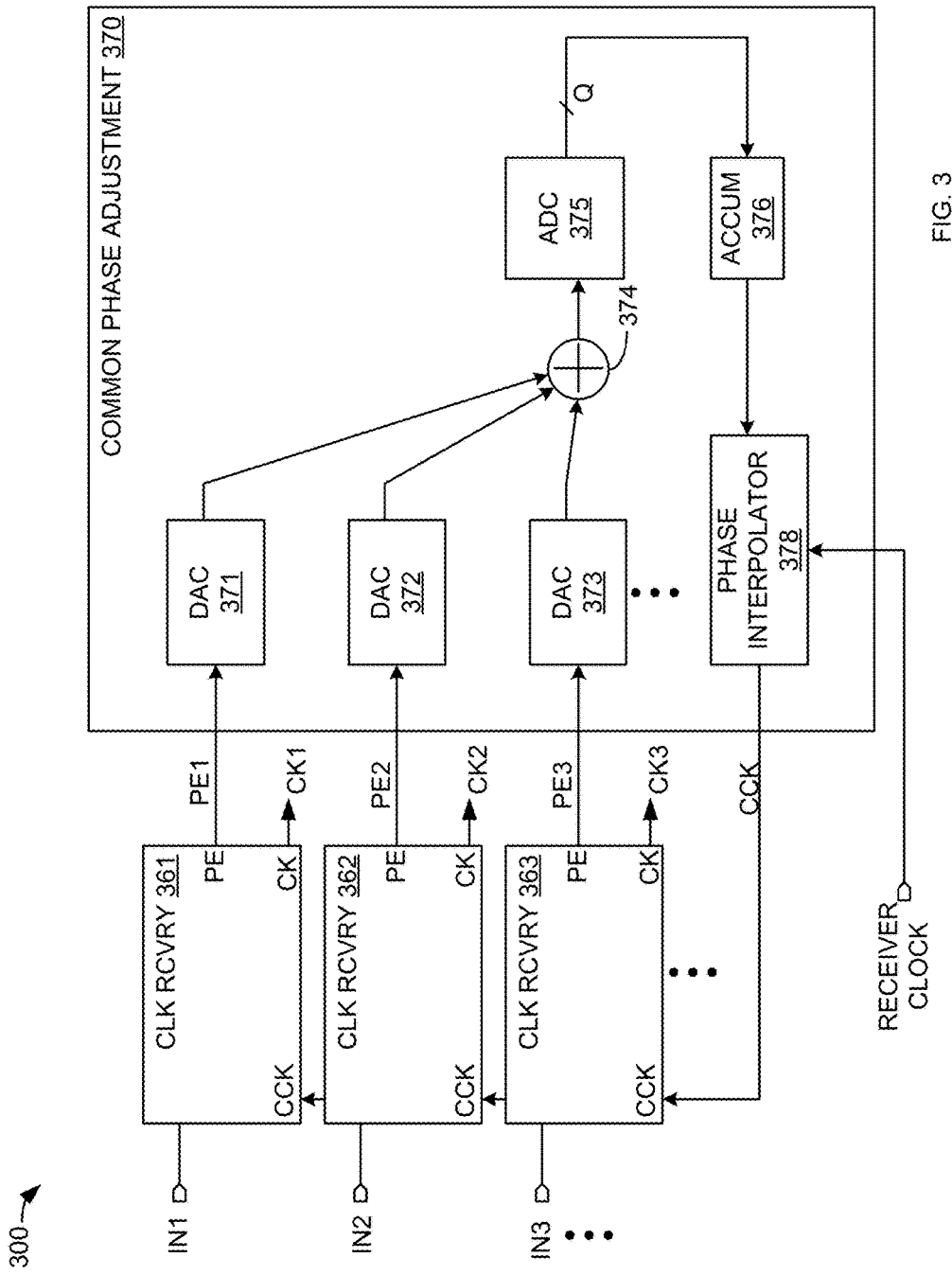
FIG. 3 is a block diagram of a receiver system with collaborative clock and data recovery.

FIG. 3 is a block diagram of a receiver system with collaborative clock and data recovery. In FIG. 3, collaborative system 300 comprises clock recovery circuit 361, clock recovery circuit 362, clock recovery circuit 363, and common phase adjustment circuit 370. Clock recovery 361 receives a first data input signal (IN1), receives a commonly adjusted clock signal (CCK), outputs a first phase error signal (PE1), and outputs a first recovered clock signal CK1. Clock recovery 362 receives a second data input signal (IN2), receives a commonly adjusted clock signal (CCK), outputs a second phase error signal (PE2), and outputs a second recovered clock signal CK2. Clock recovery 363 receives a third data input signal (IN3), receives a commonly adjusted clock signal (CCK), outputs a third phase error signal (PE3), and outputs a third recovered clock signal CK3. Additional clock recovery circuits (not illustrated in FIG. 3) that receive additional data input signals, receive commonly adjusted clock signal (CCK), and provide respective phase error signals to common phase adjustment 370 may also be included in system 300. However, these have been omitted for the sake of brevity.

Each clock recovery circuit 361-363 receives commonly adjust clock signal CCK from common phase adjustment 370. Each of the phase error signals (i.e., PE1, PE2, PE3, etc.) output by clock recovery circuits 361-363 are provided to common phase adjustment 370. These phase error signals represent the phase difference between the respective input signal (i.e., IN1, IN2, etc.) and the respective recovered clock signal (i.e., CK1, CK2, etc.) produced by that clock recovery circuit 361-363 (which is based on commonly adjusted clock signal CCK). Thus, it should be understood that common phase adjustment 370 can correspond in function and structure to common phase adjustment 170 of FIG. 1. Likewise, it should be understood that clock recovery circuits 361-363 can correspond in function and structure to clock recovery circuits 161-162 of FIG. 1, and/or clock recovery circuit 260 of FIG. 2.

Common phase adjustment 370 includes digital-to-analog converter (DAC) 371, DAC 372, DAC 373, summer 374, analog-to-digital converter ADC 375, accumulator 376, and phase interpolator 378. DAC 371 receives phase error signal PE1 from clock recovery 361. DAC 372 receives phase error signal PE2 from clock recovery 362. DAC 373 receives phase error signal PE3 from clock recovery 363. Additional phase error signals from clock recovery circuits receiving signals from additional data channels may be provided to common phase adjustment 370. However, these have been omitted for the sake of brevity.

The outputs of DACs 371-373 are added together in analog domain. The resulting analog voltage is converted to multi-bit digital output using ADC 375. Therefore, the multi-bit output of ADC 375 reflects the common phase error. Summer 374 receives the respective outputs of DACs 371-373 and adds them together. The summation of the outputs of DACs 371-373 is provided by summer 374 to analog-to-digital (ADC) converter 374. A series of Q number of bits representing the digitized values of the summed outputs of DACs 371-373 is provided to accumulator 376. In an embodiment, Q is equal to three (3)—thereby representing the values of +1, 0, and −1. These values represent the results of a 'vote' among the clock recovery circuits 361-363—where these values represent whether a majority of clock recovery circuits 361-363 found their respective CK signal too early (e.g., +1) or too late (e.g., −1), or the vote was a tie (e.g., 0). Accumulator 376 accumulates the series of digitized values from ADC 375 and provides a series of accumulated values to the control input of phase interpolator 378. This control input to phase interpolator 378 adjusts the phase of the receiver clock, by an amount controlled by the output from accumulator 376, to produce commonly adjusted timing reference CCK. Commonly adjusted timing reference CCK is provided to each of clock recovery circuits 361-363.

It should be understood that the operation of collaborative system 300 can be described in terms of a feedback loop with multiple inputs that operates similar to a delay-locked loop feedback system. A feedback signal (i.e., CCK) is adjusted locally (to produce respective recovered clock signal CK1, CK2, etc.) and which are compared by each clock recovery circuit 361-363 to respective reference signals (i.e., transitions on their respective input signal IN1, IN2, etc.). Selected results of this comparison are used to produce respective phase-error signals (i.e., PE1, PE2, etc.). The phase-error signals (or downsampled versions thereof) are summed and accumulated by common phase adjustment 370. Thus, the phase error signals from each clock recovery circuit 361-363 (PE1, PE2, etc.) can be viewed as 'voting' and the results accumulated to provide a running tally of whether a majority of recovery circuits 361-363 are detecting their respective inputs lead, lag, or are close to their respective recovered clock signal CK1, CK2, etc. The results of this 'voting' provides a control input to a phase interpolator 378 that adjusts the phase of the input receiver clock to produce the feedback signal (CCK) that completes the feedback loop.

Figure 4:
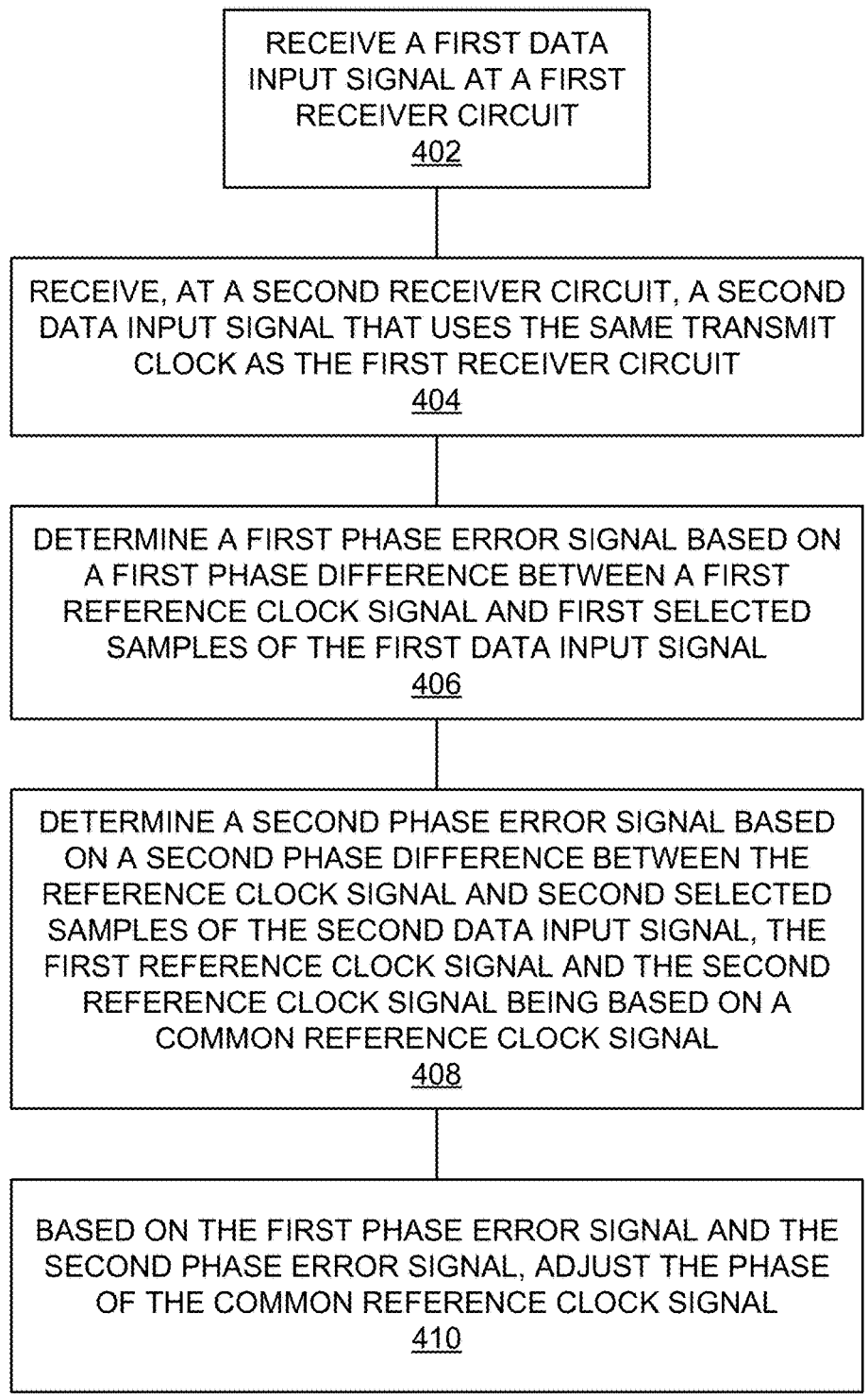
FIG. 4 is a flowchart illustrating a method of collaboration for clock and data recovery.

FIG. 4 is a flowchart illustrating a method of collaboration for clock and data recovery. The steps illustrated in FIG. 4 may be performed by one or more elements of communication system 100, receiver 200, and/or collaborative system 300. A first data input signal is received at a first receiver circuit (402). For example, data samplers 151 and clock recovery 161 may receive a first data input signal (IN1) from driving integrated circuit 110 via interconnect 141.

A second data input signal that uses the same transmit clock as the first receiver circuit is received at a second receiver circuit (404). For example, data samplers 152 and clock recovery 162 may receive a second data input signal (IN2) from driving integrated circuit 110 via interconnect 142. IN1 and IN2 are produced by driving integrated circuit 110 based on timing controlled by a common transmit clock 119.

A first phase error signal that is based on a first phase difference between a reference clock signal and first selected samples of the first data input signal is determined (406). For example, clock recovery 161 may compare the timing of selected samples of data input signal IN1 to recovered clock signal CK1 to produce phase error signal PE1. Likewise, for example, clock recovery 260 (corresponding to clock recovery 161 of FIG. 1) may compare the timing (as determined by edge sampler 255) of selected samples of IN (as selected by edge sample selector 281) to the phase adjusted clock CK (corresponding to CK1 of FIG. 1—which is a phase adjusted version of CCK). The output of this comparison can be used to produce phase error signal PE (corresponding to PE1 of FIG. 1).

A second phase error signal that is based on a second phase difference between a reference clock signal and second selected samples of the second data input signal is determined, where the first reference clock signal and the second reference clock signal are based on a common reference clock signal (408). For example, clock recovery 162 may compare the timing of selected samples of data input signal IN2 to recovered clock signal CK2 to produce phase error signal PE2, where CK1 and CK2 are phase adjusted versions of commonly adjusted clock signal CCK. Likewise, for example, clock recovery 260 (corresponding to clock recovery 162 of FIG. 1) may compare the timing (as determined by edge sampler 255) of selected samples of IN (as selected by edge sample selector 281) to the phase adjusted clock CK (corresponding to CK2 of FIG. 1—which is a phase adjusted version of CCK). The output of this comparison can be used to produce phase error signal PE (corresponding to PE2 of FIG. 1).

Based on the first phase error signal and the second phase error signal, the phase of the common reference clock signal is adjusted (410). For example, based on PE1 and PE2, common phase adjustment 170 or common phase adjustment 370 may adjust the phase of CCK. The adjustment of the phase of CCK also adjusts the phase of CK1, CK2, etc. Thus, the adjustment of the phase of CCK by common phase adjustment 170, or common phase adjustment 370, can be viewed as a common phase adjustment, while the adjustment of CCK to produce CK1, CK2, etc. by a respective clock recovery circuit 161-162 or 361-363 may be viewed as a local adjustment.

Figure 5B:
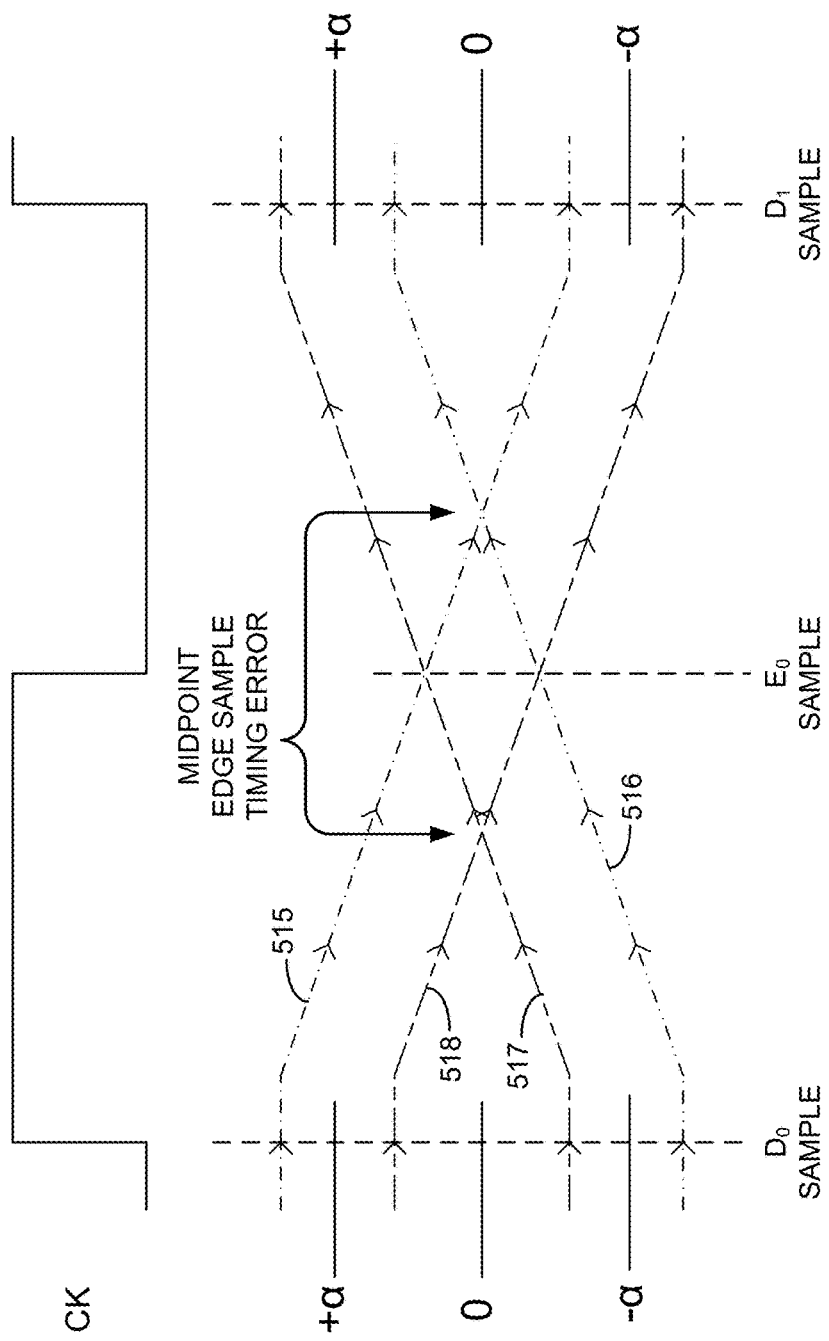
Figure 5C:
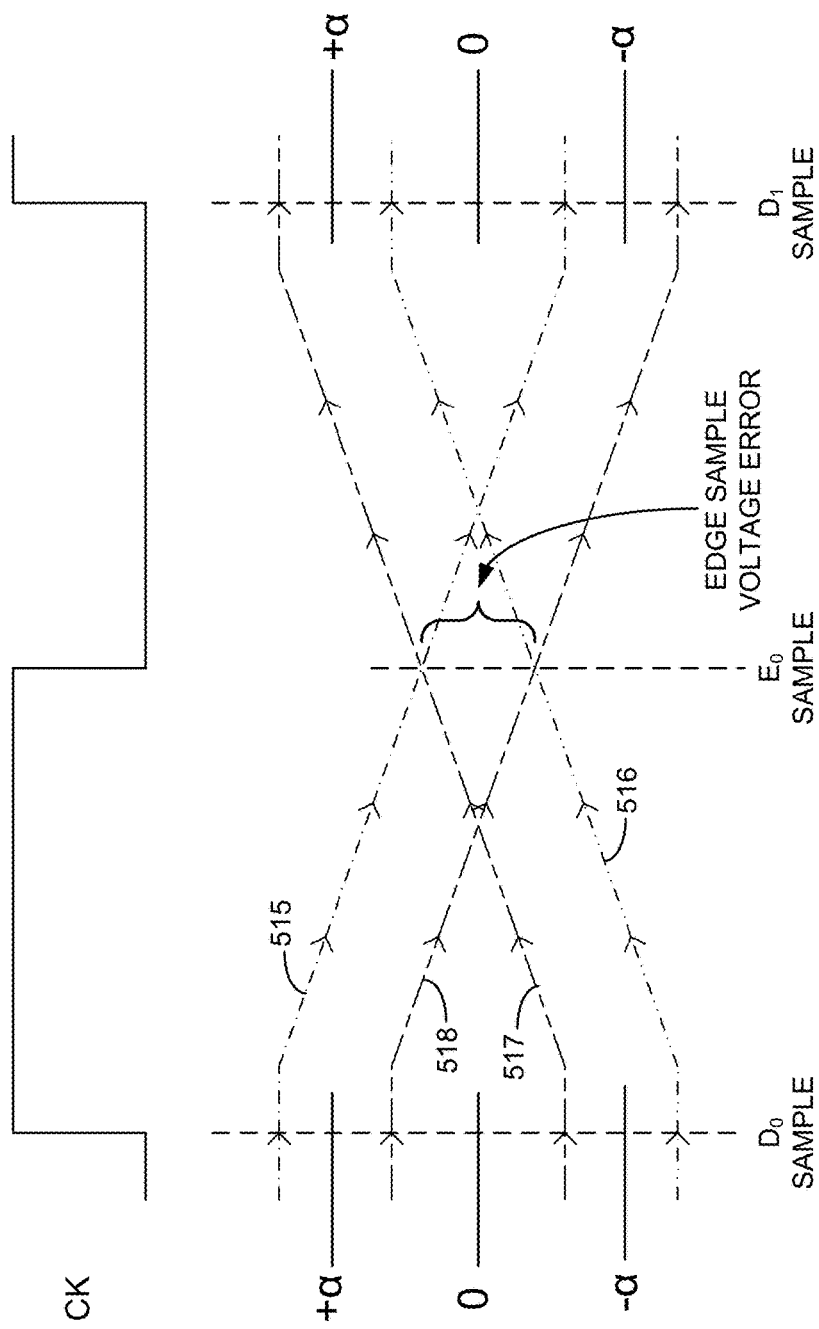

FIGS. 5A-5C are diagrams illustrating properties of example 4-level pulse-amplitude modulation (PAM-4) transitions. FIG. 5A illustrates PAM-4 transitions that are symmetrical. The transitions illustrated in FIG. 5A are considered symmetrical because the magnitude of the difference between the voltage level before the transition and a midpoint voltage (e.g., 0V) is equal to the magnitude of the difference between the voltage level after the transition and the midpoint voltage (e.g., 0V). Thus, for relatively smooth transitions, the nominal midpoint of these symmetrical transitions (e.g., at ½ the transition time) is the same voltage (i.e., the midpoint voltage) for all of the symmetrical transitions. Typically, this will be equal to the midpoint voltage (e.g., 0V).

In FIGS. 5A-5C, three data sampler (e.g., data samplers 151-152 or data samplers 251) threshold voltages are illustrated. These threshold voltages are illustrated as $-\alpha$, 0, and $+\alpha$. Transition 511 is illustrated starting at a voltage above $+\alpha$ when the reference clock (e.g., CK1, CK2, etc.) transitions from a logical low to a logical high. Transition 511 ramps down and passes through the midpoint voltage at approximately the same time the reference clock (e.g., CK1, CK2, etc.) transitions from a logical high to a logical low. Transition 511 continues to ramp down such that transition 511 is illustrated ending at a voltage below $-\alpha$ when the reference clock (e.g., CK1, CK2, etc.) again transitions from a logical low to a logical high. Thus, it should be understood that when the rising edge of the reference clock (e.g., CK1, CK2, etc.) triggers data samplers 151-152 and/or data sampler 251, data sampler 151-152 and/or data sampler 251 would resolve transition 511 at time $D_0$ and $D_1$ (which are coincident with the rising edge of the reference clock) as given in Table 1.

TABLE 1

Data sampler outputs for transition 511

| Sampler threshold | Sampler output from sample at time $D_0$ | Sampler output from sample at time $D_1$ |
| --- | --- | --- |
| $+\alpha$ | IN > $+\alpha$ | IN < $+\alpha$ |
| 0 | IN > 0 | IN < 0 |
| $-\alpha$ | IN > $-\alpha$ | IN < $-\alpha$ |

Transition 512 is illustrated starting at a voltage below $-\alpha$ when the reference clock (e.g., CK1, CK2, etc.) transitions from a logical low to a logical high. Transition 512 ramps up and passes through the midpoint voltage at approximately the same time the reference clock (e.g., CK1, CK2, etc.) transitions from a logical high to a logical low. Transition 512 continues to ramp up such that transition 512 is illustrated ending at a voltage above $+\alpha$ when the reference clock (e.g., CK1, CK2, etc.) again transitions from a logical low to a logical high. Thus, it should be understood that when the rising edge of the reference clock (e.g., CK1, CK2, etc.) triggers data samplers 151-152 and/or data sampler 251, data sampler 151-152 and/or data sampler 251 would resolve transition 512 at times $D_0$ and $D_1$ (which are coincident with the rising edge of the reference clock) as given in Table 2.

TABLE 2

Data sampler outputs for transition 512

| Sampler threshold | Sampler output from sample at time $D_0$ | Sampler output from sample at time $D_1$ |
|---|---|---|
| $+\alpha$ | IN < $+\alpha$ | IN > $+\alpha$ |
| 0 | IN < 0 | IN > 0 |
| $-\alpha$ | IN < $-\alpha$ | IN > $-\alpha$ |

Transition 513 is illustrated starting at a voltage between $-\alpha$ and 0 when the reference clock (e.g., CK1, CK2, etc.) transitions from a logical low to a logical high. Transition 513 ramps up and passes through the midpoint voltage at approximately the same time the reference clock (e.g., CK1, CK2, etc.) transitions from a logical high to a logical low. Transition 513 continues to ramp up such that transition 513 is illustrated ending at a voltage between $+\alpha$ and 0 when the reference clock (e.g., CK1, CK2, etc.) again transitions from a logical low to a logical high. Thus, it should be understood that when the rising edge of the reference clock (e.g., CK1, CK2, etc.) triggers data samplers 151-152 and/or data sampler 251, data sampler 151-152 and/or data sampler 251 would resolve transition 513 at times $D_0$ and $D_1$ (which are coincident with the rising edge of the reference clock) as given in Table 3.

TABLE 3

Data sampler outputs for transition 513

| Sampler threshold | Sampler output from sample at time $D_0$ | Sampler output from sample at time $D_1$ |
|---|---|---|
| $+\alpha$ | IN < $+\alpha$ | IN < $+\alpha$ |
| 0 | IN < 0 | IN > 0 |
| $-\alpha$ | IN > $-\alpha$ | IN > $-\alpha$ |

Transition 514 is illustrated starting at a voltage between $+\alpha$ and 0 when the reference clock (e.g., CK1, CK2, etc.) transitions from a logical low to a logical high. Transition 514 ramps down and passes through the midpoint voltage at approximately the same time the reference clock (e.g., CK1, CK2, etc.) transitions from a logical high to a logical low. Transition 514 continues to ramp down such that transition 514 is illustrated ending at a voltage between $-\alpha$ and 0 when the reference clock (e.g., CK1, CK2, etc.) again transitions from a logical low to a logical high. Thus, it should be understood that when the rising edge of the reference clock (e.g., CK1, CK2, etc.) triggers data samplers 151-152 and/or data sampler 251, data sampler 151-152 and/or data sampler 251 would resolve transition 513 at times $D_0$ and $D_1$ (which are coincident with the rising edge of the reference clock) as given in Table 4.

TABLE 4

Data sampler outputs for transition 514

| Sampler threshold | Sampler output from sample at time $D_0$ | Sampler output from sample at time $D_1$ |
|---|---|---|
| $+\alpha$ | IN < $+\alpha$ | IN < $+\alpha$ |
| 0 | IN > 0 | IN < 0 |
| $-\alpha$ | IN > $-\alpha$ | IN > $-\alpha$ |

It should also be understood from FIG. 5A that when the falling edge of the reference clock (e.g., CK1, CK2, etc.) triggers edge sampler 255, edge sampler 255 would resolve transition 511-314 at time $E_0$ (which is coincident with the falling edge of the reference clock) according to whether the respective waveform is above, or below, the midpoint voltage (e.g., 0V)—thereby indicating whether the falling edge of the reference clock is early, or late, relative to the input signal, IN. For example, for transition 511, an output by an edge sampler 255 output corresponding to IN>0 at time $E_0$ indicates the reference clock is earlier than IN. An output by an edge sampler 255 output corresponding to IN<0 at time $E_0$ indicates the reference clock is later than IN. Thus, for transitions 511-514, edge sampler 255 can act as a phase detector that determines whether the phase of the reference clock (e.g., CK, CK1, CK2, etc.) is earlier than, or later than, the input signal IN.

FIGS. 5B and 5C illustrate PAM-4 transitions that are asymmetrical. The transitions illustrated in FIGS. 5B and 5C are considered asymmetrical because the magnitude of the difference between the voltage level before the transition and a midpoint voltage (e.g., 0V) is not equal to the magnitude of the difference between the voltage level after the transition and the midpoint voltage (e.g., 0V). Thus, for relatively smooth transitions, the nominal midpoint of these asymmetrical transitions (e.g., at ½ the transition time) is not the same voltage (i.e., the midpoint voltage) as the symmetrical transitions, or some of the other asymmetrical transitions.

Transition 515 is illustrated starting at a voltage above $+\alpha$ when the reference clock (e.g., CK1, CK2, etc.) transitions from a logical low to a logical high. Transition 515 ramps down and passes through a voltage above the midpoint voltage at approximately the same time the reference clock (e.g., CK1, CK2, etc.) transitions from a logical high to a logical low. Transition 515 continues to ramp down such that transition 515 is illustrated ending at a voltage between $-\alpha$ and 0 when the reference clock (e.g., CK1, CK2, etc.) again transitions from a logical low to a logical high. Thus, it should be understood that when the rising edge of the reference clock (e.g., CK1, CK2, etc.) triggers data samplers 151-152 and/or data sampler 251, data sampler 151-152 and/or data sampler 251 would resolve transition 515 at time $D_0$ and $D_1$ (which are coincident with the rising edge of the reference clock) as given in Table 5.

TABLE 5

Data sampler outputs for transition 515

| Sampler threshold | Sampler output from sample at time $D_0$ | Sampler output from sample at time $D_1$ |
|---|---|---|
| $+\alpha$ | IN > $+\alpha$ | IN < $+\alpha$ |
| 0 | IN > 0 | IN < 0 |
| $-\alpha$ | IN > $-\alpha$ | IN > $-\alpha$ |

Transition 516 is illustrated starting at a voltage below $-\alpha$ when the reference clock (e.g., CK1, CK2, etc.) transitions from a logical low to a logical high. Transition 516 ramps up and passes through a voltage below the midpoint voltage at approximately the same time the reference clock (e.g., CK1, CK2, etc.) transitions from a logical high to a logical low. Transition 516 continues to ramp up such that transition 516 is illustrated ending at a voltage between $+\alpha$ and 0 when the reference clock (e.g., CK1, CK2, etc.) again transitions from a logical low to a logical high. Thus, it should be understood that when the rising edge of the reference clock (e.g., CK1, CK2, etc.) triggers data samplers 151-152 and/or data sampler 251, data sampler 151-152 and/or data sampler 251 would resolve transition 516 at time $D_0$ and $D_1$ (which are coincident with the rising edge of the reference clock) as given in Table 6.

TABLE 6

Data sampler outputs for transition 516

| Sampler threshold | Sampler output from sample at time $D_0$ | Sampler output from sample at time $D_1$ |
|---|---|---|
| +α | IN < +α | IN < +α |
| 0 | IN < 0 | IN > 0 |
| −α | IN < −α | IN > −α |

Transition 517 is illustrated starting at a voltage between −α and 0 when the reference clock (e.g., CK1, CK2, etc.) transitions from a logical low to a logical high. Transition 517 ramps up and passes through a voltage above the midpoint voltage at approximately the same time the reference clock (e.g., CK1, CK2, etc.) transitions from a logical high to a logical low. Transition 517 continues to ramp up such that transition 517 is illustrated ending at a voltage above +α when the reference clock (e.g., CK1, CK2, etc.) again transitions from a logical low to a logical high. Thus, it should be understood that when the rising edge of the reference clock (e.g., CK1, CK2, etc.) triggers data samplers 151-152 and/or data sampler 251, data sampler 151-152 and/or data sampler 251 would resolve transition 517 at time $D_0$ and $D_1$ (which are coincident with the rising edge of the reference clock) as given in Table 7.

TABLE 7

Data sampler outputs for transition 517

| Sampler threshold | Sampler output from sample at time $D_0$ | Sampler output from sample at time $D_1$ |
|---|---|---|
| +α | IN < +α | IN > +α |
| 0 | IN < 0 | IN > 0 |
| −α | IN > −α | IN > −α |

Transition 518 is illustrated starting at a voltage between +α and 0 when the reference clock (e.g., CK1, CK2, etc.) transitions from a logical low to a logical high. Transition 518 ramps down and passes through a voltage below the midpoint voltage at approximately the same time the reference clock (e.g., CK1, CK2, etc.) transitions from a logical high to a logical low. Transition 518 continues to ramp down such that transition 518 is illustrated ending at a voltage lower than −α when the reference clock (e.g., CK1, CK2, etc.) again transitions from a logical low to a logical high. Thus, it should be understood that when the rising edge of the reference clock (e.g., CK1, CK2, etc.) triggers data samplers 151-152 and/or data sampler 251, data sampler 151-152 and/or data sampler 251 would resolve transition 518 at time $D_0$ and $D_1$ (which are coincident with the rising edge of the reference clock) as given in Table 8.

TABLE 8

Data sampler outputs for transition 518

| Sampler threshold | Sampler output from sample at time $D_0$ | Sampler output from sample at time $D_1$ |
|---|---|---|
| +α | IN < +α | IN < +α |
| 0 | IN > 0 | IN < 0 |
| −α | IN > −α | IN < −α |

It should also be understood from FIGS. 5B and 5C that when the falling edge of the reference clock (e.g., CK1, CK2, etc.) triggers edge sampler 255, edge sampler 255 would resolve transition 515-518 at time $E_0$ (which is coincident with the falling edge of the reference clock) according to whether the respective waveform is above, or below, the midpoint voltage (e.g., 0V). However, since transitions 515-518 do not nominally pass through the midpoint voltage at time $E_0$, the output of edge sampler 255 does not reliably indicate whether the falling edge of the reference clock is early, or late, relative to the input signal, IN.

Edge sample selector 281 functions to select the edge samples of symmetrical transitions 511-514 for use by phase detector 282. Edge sample selector 281 also functions to prevent the edge samples of asymmetrical transitions 515-518 from being used by phase detector 282. Thus, in an embodiment, for receiving and recovering clock signals from a PAM-4 modulated signal, edge sample selector 281 selects and rejects edge samples according to Table 9.

TABLE 9

| Data sampler indicators at time $D_0$ | Data sampler indicators at time $D_1$ | Select or reject edge sample from time $E_0$? |
|---|---|---|
| IN > +α | IN > +α | reject (no transition) |
| IN > +α | IN < +α | reject |
| IN > +α | IN > −α | reject (ambiguous) |
| IN > +α | IN < −α | SELECT |
| IN < +α | IN > +α | reject |
| IN < +α | IN < +α | reject (ambiguous) |
| IN < +α | IN > −α | SELECT |
| IN < +α | IN < −α | reject (ambiguous) |
| IN > −α | IN > +α | reject (ambiguous) |
| IN > −α | IN < +α | SELECT |
| IN > −α | IN > −α | reject (ambiguous) |
| IN > −α | IN < −α | reject |
| IN < −α | IN > +α | SELECT |
| IN < −α | IN < +α | reject (ambiguous) |
| IN < −α | IN > −α | reject |
| IN < −α | IN < −α | reject (no transition) |

Figure 6A:
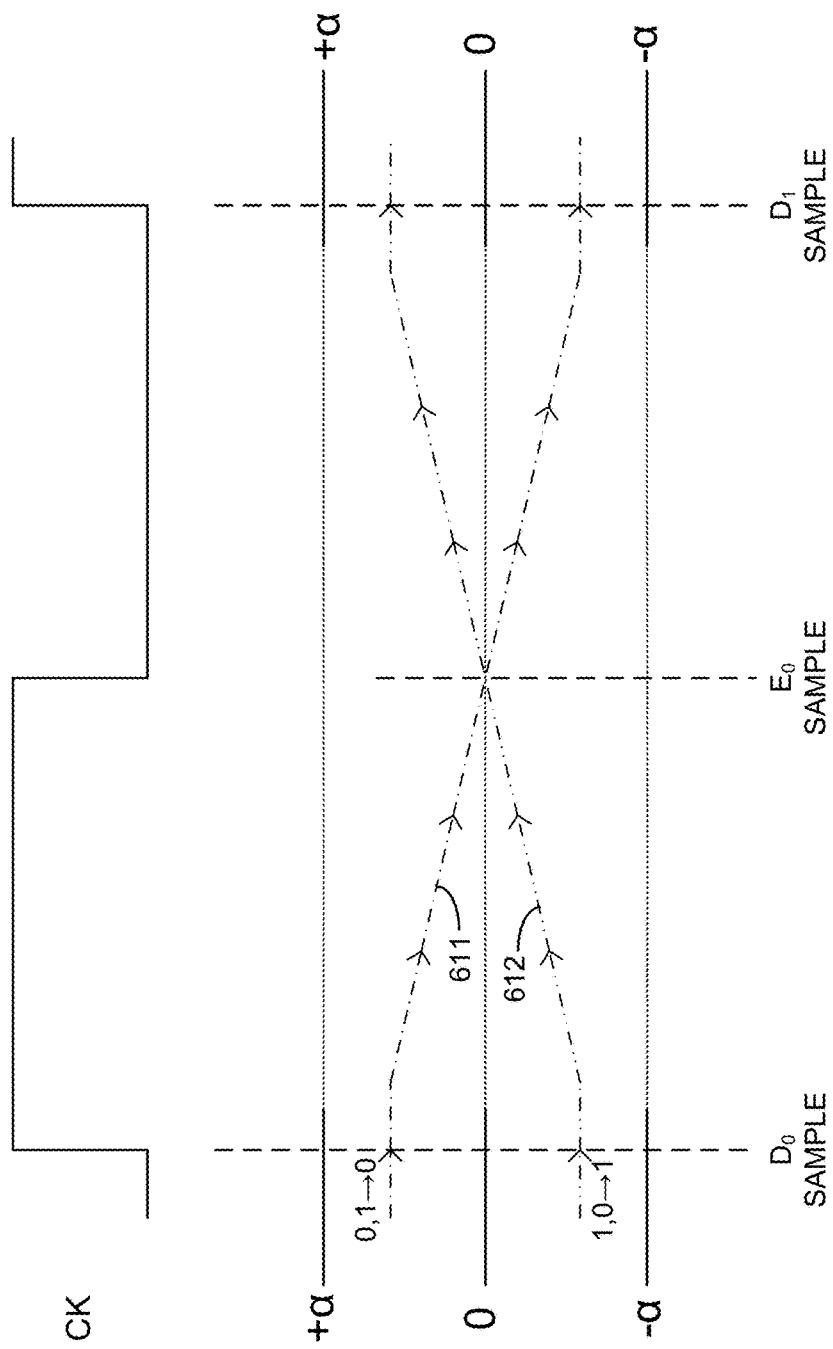
FIGS. 6A and 6B are diagrams illustrating properties of example three unit interval sequence of 2-level pulse-amplitude modulation (PAM-2) transitions with predictive decision feedback equalization (prDFE).
Figure 6B:
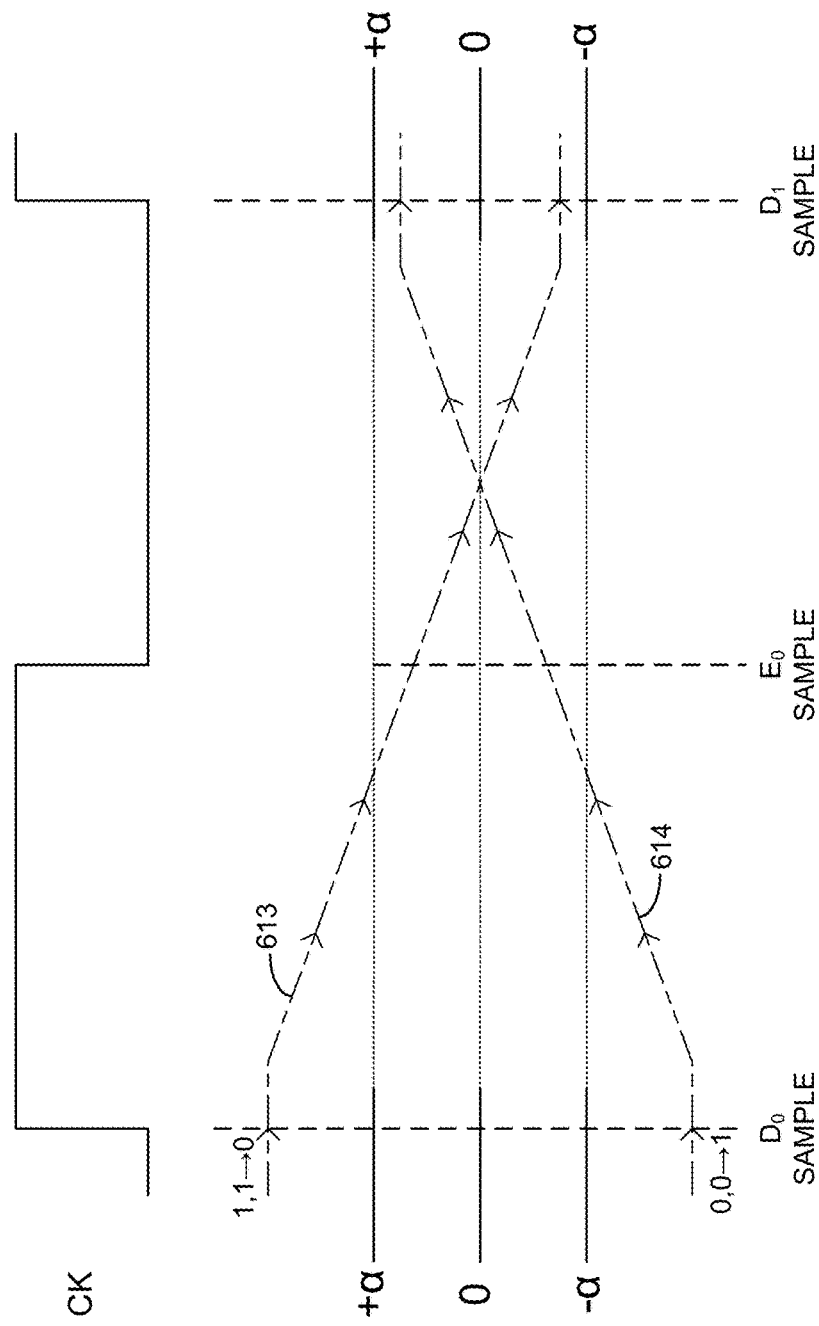

FIGS. 6A-6B are diagrams illustrating properties of example three unit interval sequence of 2-level pulse-amplitude modulation (PAM-2) transitions with predictive decision feedback equalization (prDFE). In FIGS. 6A and 6B, two data sampler (e.g., data samplers 151-152 or data samplers 251) threshold voltages are illustrated. These threshold voltages are illustrated as −α and +α. Also illustrated is a threshold voltage of 0 (i.e., midpoint between +α and −α) for an edge sampler. It should be understood that in a receiver implementing prDFE, previous bit decisions to effectively influence the current bit decision. Thus, the transitions illustrated in FIGS. 6A-6B begin at voltage levels that depend upon the previous sequence of received bit(s). In FIGS. 6A-6B, the previous two bits (e.g., those sampled at time $D_{-1}$ and $D_0$) determine the starting voltages at the input of the samplers for the illustrated transitions.

FIG. 6A illustrates symmetrical transitions at the sampler inputs of a prDFE receiver. Transition 611 is illustrated starting at a voltage greater than 0.0V and less than +α when the reference clock (e.g., CK1, CK2, etc.) transitions from a logical low to a logical high. Transition 611 is a 1 to 0 transition that occurs one unit interval after a 0 to 1 transition. This is indicated in FIGS. 6A and 6B according the notation $V_{-1}, V_0 \rightarrow V_1$ where $V_{-1}$ is the value sampled at time $D_{-1}$ (i.e., one unit interval before time $D_0$); $V_0$ is the value sampled at time $D_0$ (i.e., coincident with the first rising edge of CK), and $V_1$ is the value sampled at time $D_1$ (i.e., coincident with the second rising edge of CK). After the first rising edge of CK, transition 611 ramps down and passes through the midpoint voltage at approximately the same time the reference clock (e.g., CK1, CK2, etc.) transitions from a logical high to a logical low. Transition 611 continues to ramp down such that transition 611 is illustrated ending at a voltage greater than −α and less than 0.0V when the reference clock (e.g., CK1, CK2, etc.) again transitions from a logical low to a logical high. Thus, it should be understood that when the rising edge of the reference clock (e.g., CK1, CK2, etc.) triggers data samplers 151-152 and/or data sampler 251, data sampler 151-152 and/or data sampler 251 would resolve transition 611 at time $D_0$ as IN<+a, and resolve transition 611 at time $D_1$ as IN>−α.

Transition 612 is illustrated starting at a voltage greater than −α and less than 0.0V when the reference clock (e.g., CK1, CK2, etc.) transitions from a logical low to a logical high. Transition 612 is a 0 to 1 transition that occurs one unit interval after a 1 to 0 transition. After the first rising edge of CK, transition 612 ramps up and passes through the midpoint voltage at approximately the same time the reference clock (e.g., CK1, CK2, etc.) transitions from a logical high to a logical low. Transition 612 continues to ramp up such that transition 612 is illustrated ending at a voltage greater than 0.0V and less than +α when the reference clock (e.g., CK1, CK2, etc.) again transitions from a logical low to a logical high. Thus, it should be understood that when the rising edge of the reference clock (e.g., CK1, CK2, etc.) triggers data samplers 151-152 and/or data sampler 251, data sampler 151-152 and/or data sampler 251 would resolve transition 612 at time $D_0$ as IN>−α, and resolve transition 612 at time $D_1$ as IN<+α.

FIG. 6B illustrates asymmetrical transitions at the sampler inputs of a prDFE receiver. Transition 613 is illustrated starting at a voltage above +α when the reference clock (e.g., CK1, CK2, etc.) transitions from a logical low to a logical high. Transition 613 is a 1 to 0 transition that occurs one unit interval after two successive 1's are received. After the first rising edge of CK, transition 613 ramps down and passes through the midpoint voltage later than the time the reference clock (e.g., CK1, CK2, etc.) transitions from a logical high to a logical low. Transition 613 continues to ramp down such that transition 613 is illustrated ending at a voltage less than 0.0V and greater than −α when the reference clock (e.g., CK1, CK2, etc.) again transitions from a logical low to a logical high. Thus, it should be understood that when the rising edge of the reference clock (e.g., CK1, CK2, etc.) triggers data samplers 151-152 and/or data sampler 251, data sampler 151-152 and/or data sampler 251 would resolve transition 613 at time $D_0$ as IN>+a, and resolve transition 613 at time $D_1$ as IN>−α.

Transition 614 is illustrated starting at a voltage below −α when the reference clock (e.g., CK1, CK2, etc.) transitions from a logical low to a logical high. Transition 614 is a 0 to 1 transition that occurs one unit interval after two successive 0's are received. After the first rising edge of CK, transition 614 ramps up and passes through the midpoint voltage later than the time the reference clock (e.g., CK1, CK2, etc.) transitions from a logical high to a logical low. Transition 614 continues to ramp up such that transition 614 is illustrated ending at a voltage greater than 0.0V and less than +α when the reference clock (e.g., CK1, CK2, etc.) again transitions from a logical low to a logical high. Thus, it should be understood that when the rising edge of the reference clock (e.g., CK1, CK2, etc.) triggers data samplers 151-152 and/or data sampler 251, data sampler 151-152 and/or data sampler 251 would resolve transition 614 at time $D_0$ as IN<−α, and resolve transition 614 at time $D_1$ as IN<+α.

Note that the sampled values for symmetrical transition 611 and asymmetrical transition 613 are the same. Likewise, the sampled values for symmetrical transition 612 and asymmetrical transition 614 are also the same. However, by taking into account the sampled value at time $D_{-1}$, logic can be implemented by edge sample selector 281 that can disambiguate symmetrical transition 611 from asymmetrical transition 613, and disambiguate symmetrical transition 612 from asymmetrical transition 614. Accordingly, by also including the sampled value at time $D_{-1}$, edge sample selector 281 can select edge samples corresponding to symmetrical transitions 611 and 612, while rejecting edge samples from other transitions such as asymmetrical transitions 613 and 614. Thus, with +α and −α selected as illustrated in FIGS. 6A-6B, it should be understood that, for example, the selection and rejection of the transitions illustrated in FIGS. 6A-6B can be done according to Table 9.

Figure 7A:
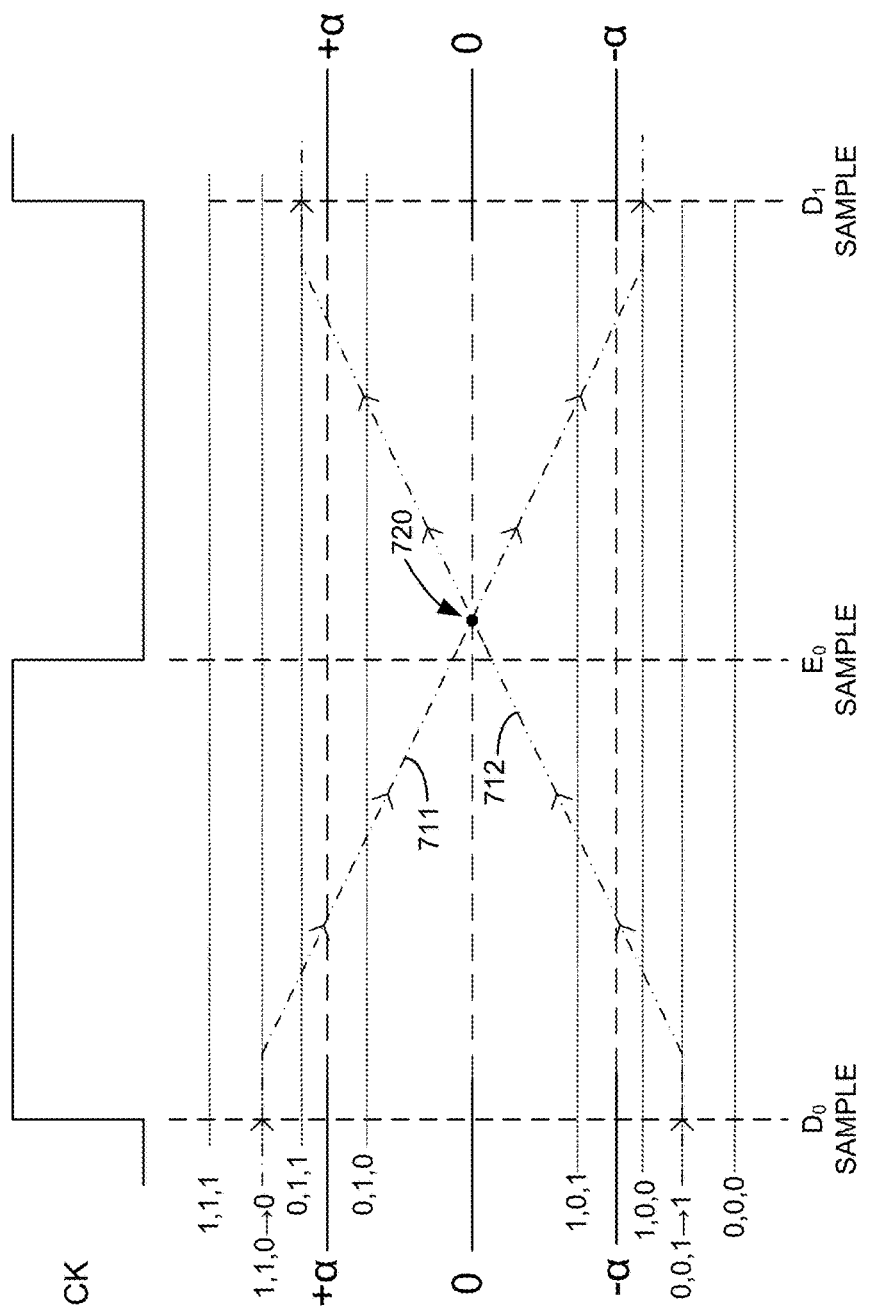
FIGS. 7A, 7B, and 7C are diagrams illustrating properties of example four unit interval sequence of 2-level pulse-amplitude modulation (PAM-2) transitions with predictive decision feedback equalization (prDFE).
Figure 7B:
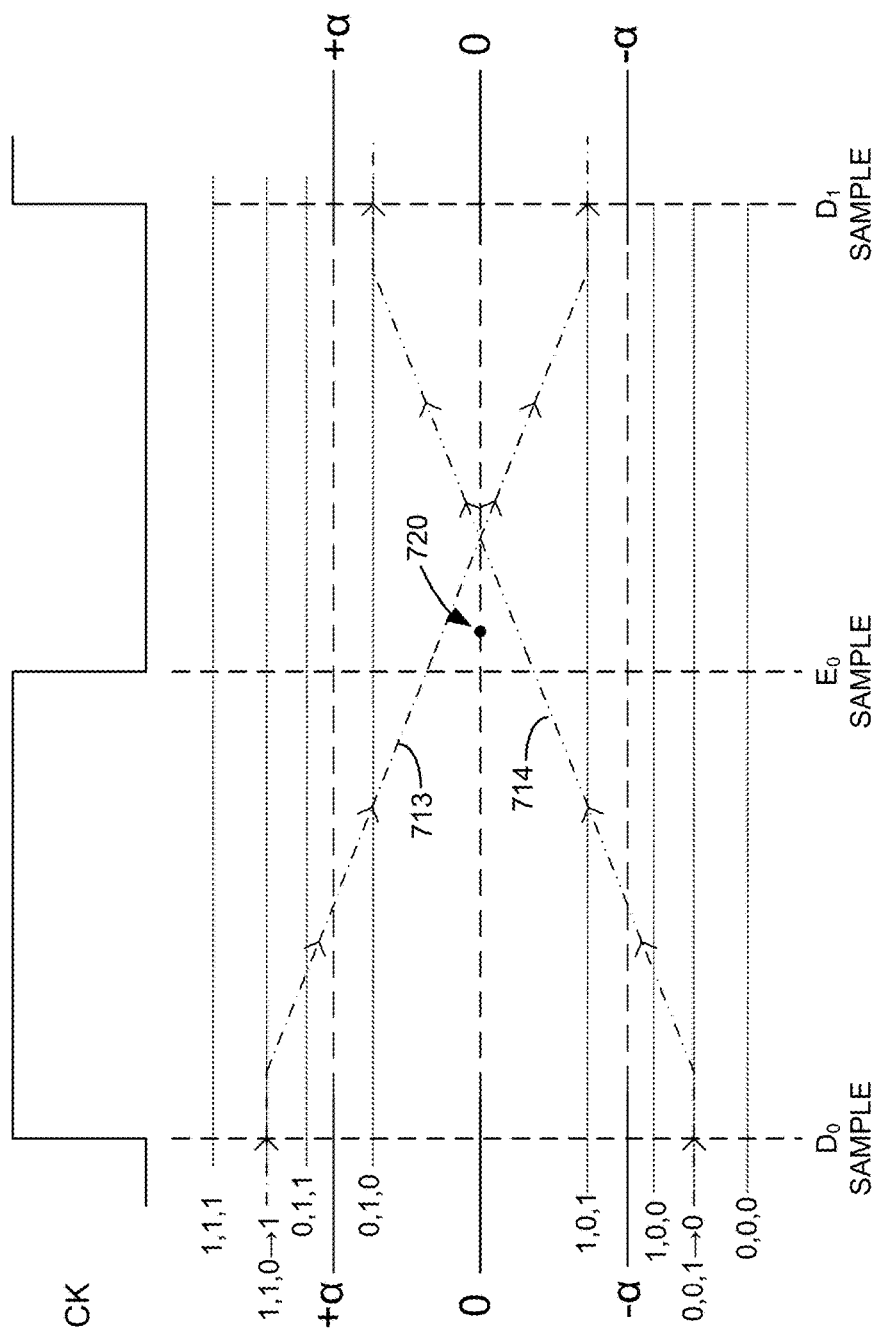
Figure 7C:
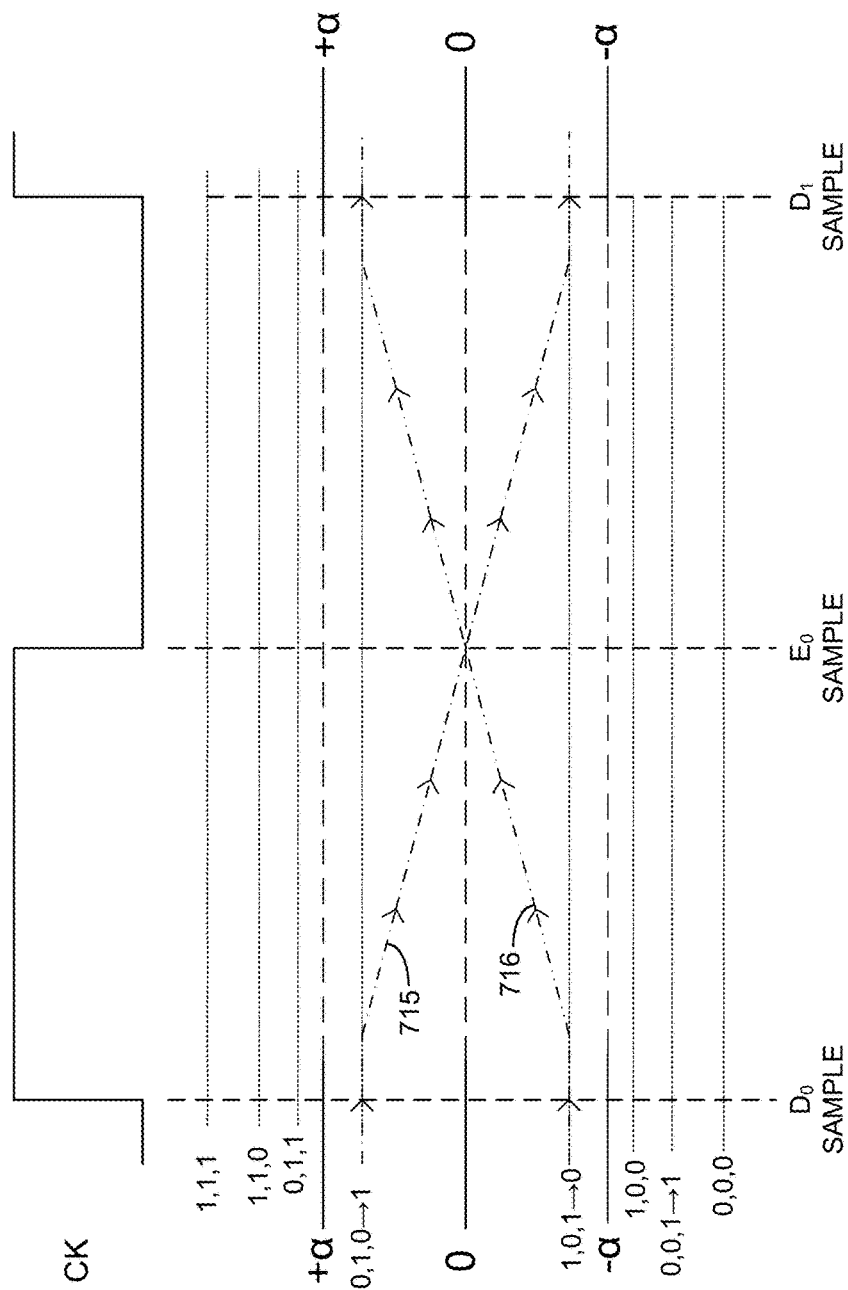

FIGS. 7A-7C are diagrams illustrating properties of four unit interval sequence of 2-level pulse-amplitude modulation (PAM-2) transitions with predictive decision feedback equalization (prDFE). In FIGS. 7A-7C, two data sampler (e.g., data samplers 151-152 or data samplers 251) threshold voltages are illustrated. These threshold voltages are illustrated as −α and +α. Also illustrated is a threshold voltage of 0 (i.e., midpoint between +α and −α) for an edge sampler. As discussed herein, for a receiver implementing prDFE, the previous bit decisions to effectively influence the current bit decision. Thus, the transitions illustrated in FIGS. 7A-7C begin at voltage levels that depend upon the previous sequence of received bit(s). In FIGS. 7A-7C, the previous three bits (e.g., those sampled at time $D_{-2}$, $D_{-1}$ and $D_0$) determine the starting voltages at the input of the samplers for the illustrated transitions.

FIG. 7A illustrates approximately symmetrical transitions at the sampler inputs of a prDFE receiver. Transition 711 is illustrated starting at a voltage above +α when the reference clock (e.g., CK1, CK2, etc.) transitions from a logical low to a logical high. Transition 711 is a transition that occurs after two successive 1's (which occur first) and between two successive 0's (which occur second). This is indicated in FIGS. 7A-7C according the notation $V_{-2}, V_{-1}, V_0 \rightarrow V_1$ where $V_{-2}$ is the value sampled at time $D_{-2}$ (i.e., two unit intervals before time $D_0$); $V_{-1}$ is the value sampled at time $D_{-1}$ (i.e., one unit intervals before time $D_0$); coincident with the first rising edge of CK); $V_0$ is the value sampled at time $D_0$ (i.e., coincident with the first rising edge of CK); and, $V_1$ is the value sampled at time $D_1$ (i.e., coincident with a second rising edge of CK). After the first rising edge of CK, transition 711 ramps down and passes through the midpoint voltage at a time slightly later than the reference clock (e.g., CK1, CK2, etc.) transitions from a logical high to a logical low. Transition 711 continues to ramp down such that transition 711 is illustrated ending at a voltage below −α when the reference clock (e.g., CK1, CK2, etc.) again transitions from a logical low to a logical high. Thus, it should be understood that when the rising edge of the reference clock (e.g., CK1, CK2, etc.) triggers data samplers 151-152 and/or data sampler 251, data sampler 151-152 and/or data sampler 251 would resolve transition 711 at time $D_0$ as IN>+α, and resolve transition 711 at time $D_1$ as IN>-α.

Transition 712 is illustrated starting at a voltage below -α when the reference clock (e.g., CK1, CK2, etc.) transitions from a logical low to a logical high. Transition 712 is a 0 to 1 transition that occurs after two successive 0's (which occur first) and between two successive 1's (which occur second). After the first rising edge of CK, transition 712 ramps up and passes through the midpoint voltage at the same time transition 711 passes through the midpoint voltage. This crossing point of transition 711 and 712 is labeled point 720 in FIGS. 7A and 7B. Transition 712 continues to ramp up such that transition 712 is illustrated ending at a voltage above +α when the reference clock (e.g., CK1, CK2, etc.) again transitions from a logical low to a logical high. Thus, it should be understood that when the rising edge of the reference clock (e.g., CK1, CK2, etc.) triggers data samplers 151-152 and/or data sampler 251, data sampler 151-152 and/or data sampler 251 would resolve transition 712 at time $D_0$ as IN>-α, and resolve transition 712 at time $D_1$ as IN>+α.

FIG. 7B illustrates asymmetrical transitions at the sampler inputs of a prDFE receiver. Transition 713 is illustrated starting at a voltage above +α when the reference clock (e.g., CK1, CK2, etc.) transitions from a logical low to a logical high. Transition 713 is a1 to 0 transition that occurs between two successive 1's (which occur before the 1 to 0 transition) and a 0 to 1 transition (which occurs after the 1 to 0 transition). After the first rising edge of CK, transition 713 ramps down and passes through the midpoint voltage later than the time the reference clock (e.g., CK1, CK2, etc.) transitions from a logical high to a logical low, and later than point 720. Transition 713 continues to ramp down such that transition 713 is illustrated ending at a voltage below 0 but above -α when the reference clock (e.g., CK1, CK2, etc.) again transitions from a logical low to a logical high. Thus, it should be understood that when the rising edge of the reference clock (e.g., CK1, CK2, etc.) triggers data samplers 151-152 and/or data sampler 251, data sampler 151-152 and/or data sampler 251 would resolve transition 713 at time $D_0$ as IN>+a, and resolve transition 713 at time $D_1$ as IN>-α.

Transition 714 is illustrated starting at a voltage below -α when the reference clock (e.g., CK1, CK2, etc.) transitions from a logical low to a logical high. Transition 714 is a 0 to 1 transition that occurs between two successive 0's (which occur before the 0 to 1 transition) and a 1 to 0 transition (which occurs after the 0 to 1 transition). After the first rising edge of CK, transition 714 ramps up and passes through the midpoint voltage later than the time the reference clock (e.g., CK1, CK2, etc.) transitions from a logical high to a logical low. Transition 614 continues to ramp up such that transition 714 is illustrated ending at a voltage above 0 but below +α when the reference clock (e.g., CK1, CK2, etc.) again transitions from a logical low to a logical high. Thus, it should be understood that when the rising edge of the reference clock (e.g., CK1, CK2, etc.) triggers data samplers 151-152 and/or data sampler 251, data sampler 151-152 and/or data sampler 251 would resolve transition 714 at time $D_0$ as IN<-α, and resolve transition 714 at time $D_1$ as IN<+α.

FIG. 7C illustrates symmetrical transitions at the sampler inputs of a prDFE receiver. Transition 715 is illustrated starting at a voltage greater than 0.0V and below +α when the reference clock (e.g., CK1, CK2, etc.) transitions from a logical low to a logical high. Transition 715 is a 0 to 1 transition from the last 0 of the sequence 0, 1, 0 (which occurs first) and a subsequent 1 (which occurs second). After the first rising edge of CK, transition 715 ramps down and passes through the midpoint voltage (i.e., 0.0V) at approximately the same time the reference clock (e.g., CK1, CK2, etc.) transitions from a logical high to a logical low. Transition 715 continues to ramp down such that transition 715 is illustrated ending at a voltage less than 0.0V and greater than -α when the reference clock (e.g., CK1, CK2, etc.) again transitions from a logical low to a logical high. Thus, it should be understood that when the rising edge of the reference clock (e.g., CK1, CK2, etc.) triggers data samplers 151-152 and/or data sampler 251, data sampler 151-152 and/or data sampler 251 would resolve transition 715 at time $D_0$ as IN<+α, and resolve transition 715 at time $D_1$ as IN>-α.

Transition 716 is illustrated starting at a voltage greater than -α and less than 0.0V when the reference clock (e.g., CK1, CK2, etc.) transitions from a logical low to a logical high. Transition 716 is a 1 to 0 transition from the last 1 of the sequence 1, 0, 1 (which occurs first) and a subsequent 0 (which occurs second). After the first rising edge of CK, transition 716 ramps up and passes through the midpoint voltage at the same time transition 715 passes through the midpoint voltage. Transition 716 continues to ramp up such that transition 716 is illustrated ending at a voltage greater than 0.0V and less than +α when the reference clock (e.g., CK1, CK2, etc.) again transitions from a logical low to a logical high. Thus, it should be understood that when the rising edge of the reference clock (e.g., CK1, CK2, etc.) triggers data samplers 151-152 and/or data sampler 251, data sampler 151-152 and/or data sampler 251 would resolve transition 716 at time $D_0$ as IN>-α, and resolve transition 716 at time $D_1$ as IN<+α.

By taking into account the sampled value at time $D_{-1}$, logic can be implemented by edge sample selector 281 that selects transitions 711, 712, 715, and 716 (which cross the midpoint voltage either at, or closest in time to the $E_0$ sample time) and rejects other transitions (e.g., asymmetrical transitions 713 and 714.) Accordingly, by also including the sampled value at time $D_{-1}$, edge sample selector 281 can select edge samples corresponding to transitions 711, 712, 715, and 716 while rejecting edge samples from other transitions such as asymmetrical transitions 713 and 714. In particular, the $V_{-2}$, $V_{-1}$, $V_0$, $V_1$ sequences of 0101, 1010, 1100, and 0011 can be used to identify transitions that whose edge samples should be selected, and the sequences of 1101, 0010, 0100, and 1011 can be used to identify transitions whose edge samples should be rejected. Thus, with +α and -α selected as illustrated in FIG. 7A-7C, it should be understood that, for example, the selection and rejection of the transitions illustrated in FIGS. 7A-7C can be done according to Table 9.

Figure 8A:
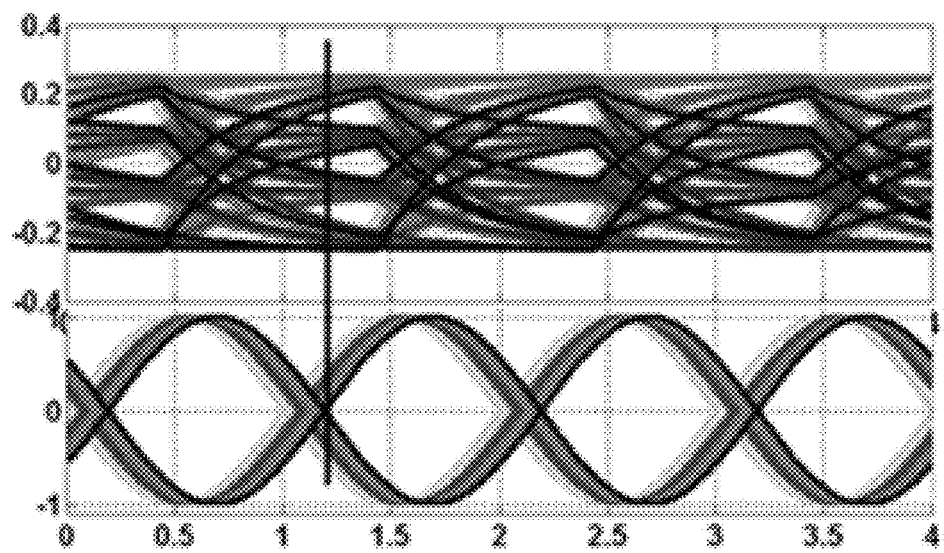
FIG. 8A illustrates timing diagrams of an example 4-level pulse-amplitude modulation signal and an example recovered clock.

FIG. 8A illustrates timing diagrams of an example 4-level pulse-amplitude modulation signal and an example recovered clock. In FIG. 8A, the top plot illustrates the eye diagram of a PAM-4 signal. The bottom plot in FIG. 8A illustrates the clock signals recovered from the PAM-4 signal using collaborative clock recovery.

Figure 8B:
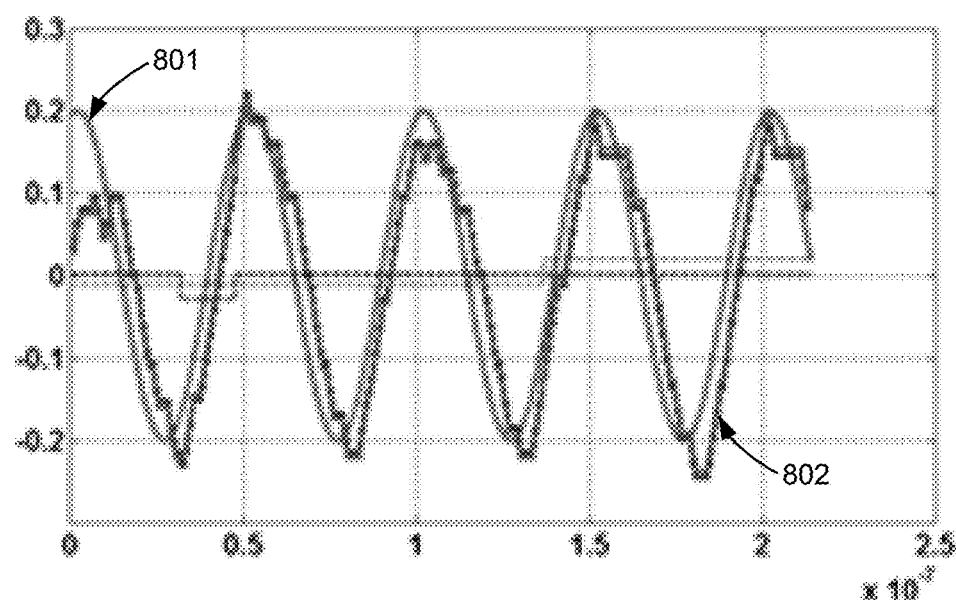
FIG. 8B illustrates jitter tracking by a collaborative clock and data recovery system.

FIG. 8B illustrates jitter tracking by a collaborative clock and data recovery system. Plot 801 is FIG. 8B illustrates an example amount of jitter that varies over time (in the case illustrated in FIG. 8B, the jitter varies over time in a sinusoidal manner.) Plot 802 illustrates the jitter of plot 801 as tracked by a collaborative clock recovery circuit. The plots in FIGS. 8A and 8B reflect a data rate of 56 Gb/s, a phase step of 32 unit intervals, a local phase error digitization frequency of 450 MHz, a shared digitization frequency of 3 GHz (e.g., sample rate of ADC 375), and a latency from a jitter change to phase adjustment of 6 cycles of the digitization frequency.

Figure 9A:
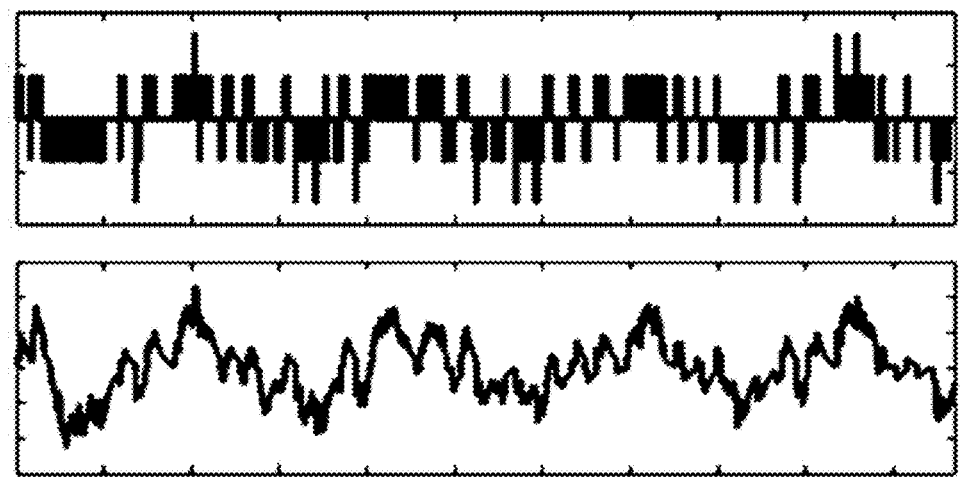
FIG. 9A illustrates example summed current and summing node voltage waveforms of a multiple phase error input time-to-digital converter.
Figure 9B:
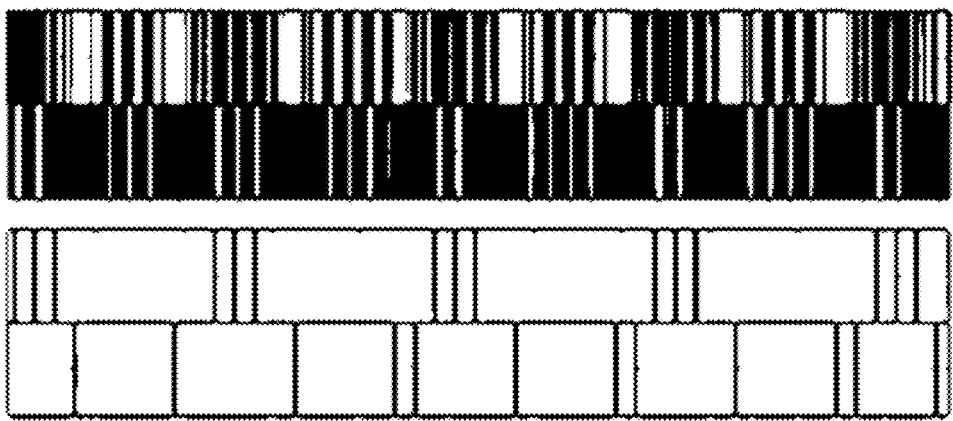
FIG. 9B illustrates multiple phase error inputs before and after majority voting.

FIG. 9A illustrates example summed current and summing node voltage waveforms of a multiple phase error input time-to-digital converter. FIG. 9B illustrates multiple phase error inputs before and after majority voting. In FIG. 9A, the top plot illustrates the current sum of the common phase adjustment summer (e.g., summer 374). The bottom plot of FIG. 9A illustrates the output node voltage of the summer (e.g., summer 374). In FIG. 9B, the top plot illustrates the phase detector outputs (e.g., PE1, PE2, etc.) from the clock recovery circuits (e.g., clock recovery 361-363.) The bottom plot of FIG. 9B illustrates the output of the accumulator of the common phase adjustment circuit (e.g., accumulator 376 of common phase adjustment 370).

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of communication system 100, receiver 200, and/or collaborative system 300, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 10:
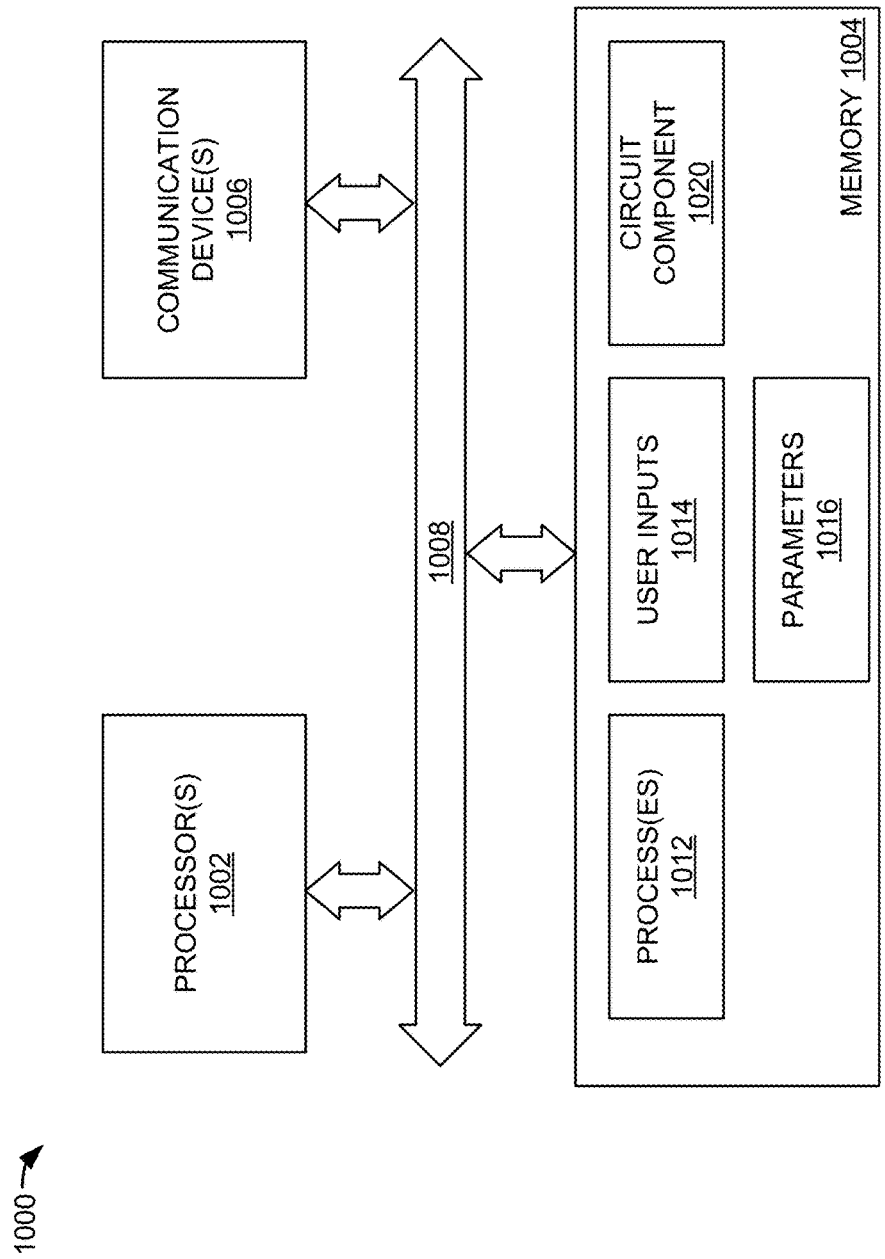
FIG. 10 is a block diagram of a computer system.

FIG. 10 is a block diagram illustrating one embodiment of a processing system 1000 for including, processing, or generating, a representation of a circuit component 1020. Processing system 1000 includes one or more processors 1002, a memory 1004, and one or more communications devices 1006. Processors 1002, memory 1004, and communications devices 1006 communicate using any suitable type, number, and/or configuration of wired and/or wireless connections 1008.

Processors 1002 execute instructions of one or more processes 1012 stored in a memory 1004 to process and/or generate circuit component 1020 responsive to user inputs 1014 and parameters 1016. Processes 1012 may be any suitable electronic design automation (EDA) tool or portion thereof used to design, simulate, analyze, and/or verify electronic circuitry and/or generate photomasks for electronic circuitry. Representation 1020 includes data that describes all or portions of countermeasure circuit 100, countermeasure circuit 300, countermeasure topology 400, latch 800, and/or integrated circuit 910, as shown in the Figures.

Representation 1020 may include one or more of behavioral, register transfer, logic component, transistor, and layout geometry-level descriptions. Moreover, representation 1020 may be stored on storage media or communicated by carrier waves.

Data formats in which representation 1020 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 1014 may comprise input parameters from a keyboard, mouse, voice recognition interface, microphone and speakers, graphical display, touch screen, or other type of user interface device. This user interface may be distributed among multiple interface devices. Parameters 1016 may include specifications and/or characteristics that are input to help define representation 1020. For example, parameters 1016 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 1004 includes any suitable type, number, and/or configuration of non-transitory computer-readable storage media that stores processes 1012, user inputs 1014, parameters 1016, and circuit component 1020.

Communications devices 1006 include any suitable type, number, and/or configuration of wired and/or wireless devices that transmit information from processing system 1000 to another processing or storage system (not shown) and/or receive information from another processing or storage system (not shown). For example, communications devices 1006 may transmit circuit component 1020 to another system. Communications devices 1006 may receive processes 1012, user inputs 1014, parameters 1016, and/or circuit component 1020 and cause processes 1012, user inputs 1014, parameters 1016, and/or circuit component 1020 to be stored in memory 1004.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An integrated circuit, comprising:
a plurality of receiver circuits, the plurality of receiver circuits each comprising:

at least one data sampler to receive a pulse amplitude modulated signal having transitions and to produce respective data sampler outputs responsive to at least one sample clock;
at least one edge sampler to produce respective edge sampler outputs responsive to the at least one sample clock;
a phase detector responsive to the edge sampler outputs associated with a subset of said transitions, said subset of said transitions being selected based at least in part on said respective data sampler outputs, said phase detector to produce a phase error signal; and,
a first phase adjustment circuit responsive to the phase error signal and an input clock signal to produce the at least one sample clock;
a second phase adjustment circuit responsive to the phase error signals from each of the plurality of receiver circuits to produce the input clock signal.

2. The integrated circuit of claim 1, wherein the phase error signals from each of the plurality of receiver circuits are proportionally combined by the second phase adjustment circuit.

3. The integrated circuit of claim 2, wherein members of the subset of said transitions are selected within a first number of clock cycles.

4. The integrated circuit of claim 3, wherein the first number of clock cycles is less than a deserialization width to be applied to the data sampler outputs.

5. The integrated circuit of claim 1, wherein each one of the phase error signals is based on a proportional phase error component and an integral phase error component.

6. The integrated circuit of claim 1, wherein each one of the phase error signals is effectively based on only an integral phase error component.

7. The integrated circuit of claim 1, wherein each one of the phase error signals is effectively based on only a proportional phase error component.

8. An integrated circuit, comprising:
a first set of at least two data samplers to compare a first input signal to a respective at least two threshold voltages based on a common timing reference signal;
a second set of at least two data samplers to compare a second input signal to the respective at least two threshold voltages based on the common timing reference signal;
a first edge sampler to compare the first input signal to a first threshold voltage based on the common timing reference signal;
a second edge sampler to compare the second input signal to the first threshold voltage based on the common timing reference signal;
a reference clock signal generator circuit to produce a reference clock signal;
a timing reference signal recovery circuit to adjust a timing of the reference clock signal to produce the common timing reference signal, the adjustment of the timing of the reference clock signal to be based at least in part on a first phase error signal that is based on selected comparisons of the first input signal from the first edge sampler, the adjustment of the timing of the reference clock signal to also be based at least in part on a second phase error signal that is based on selected comparisons of the second input signal from the second edge sampler.

9. The integrated circuit of claim 8, wherein the selected comparisons of the input signal from the first edge sampler are selected based on comparisons of the first input signal from the first set of at least two data samplers.

10. The integrated circuit of claim 8, wherein the adjustment of the timing of the reference clock signal to be further based on a third phase error signal.

11. The integrated circuit of claim 10, wherein the third phase error signal is based on a third edge sampler that compares a third input signal to the first threshold voltage.

12. The integrated circuit of claim 8, wherein the timing reference signal recovery circuit adjusts the timing of the reference clock signal using at least one phase interpolator.

13. The integrated circuit of claim 8, wherein the respective at least two threshold voltages are configured to resolve a 2-level pulse amplitude modulation (PAM-2) input signal.

14. The integrated circuit of claim 8, wherein the respective at least two threshold voltages are configured to resolve a 4-level pulse amplitude modulation (PAM-4) input signal.

15. A method of operating an integrated circuit, comprising:
generating a periodic reference clock signal;
comparing, at a first series of timings that are based on a common timing reference signal, a first input signal to a respective at least two threshold voltages using a first set of at least two data samplers;
comparing, at a second series of timings that are based on the common timing reference signal, the first input signal to a first threshold voltage using a first edge sampler;
comparing, at a second series of timings that are based on common timing reference signal, a second input signal to the respective at least two threshold voltages using a second set of at least two data samplers;
comparing, at a second series of timings that are based on the common timing reference signal, the second input signal to the first threshold voltage using a second edge sampler;
selecting comparisons of the first input signal made by the first edge sampler;
generating a first phase error signal based at least in part on the selected comparisons of the first input signal from the first edge sampler;
generating a second phase error signal based at least in part on the selected comparisons of the second input signal from the second edge sampler;
adjusting, based on the first phase error signal and the second phase error signal, a timing of the periodic reference clock signal to produce the common timing reference signal.

16. The method of claim 15, wherein the comparisons of the input timing signal that are selected from the first edge sampler are selected based on the comparisons of the first input signal that are made by the first set of at least two data samplers.

17. The method of claim 15, wherein the adjusting of the timing of the periodic reference clock signal to produce the common timing reference signal is further based on a third phase error signal.

18. The method of claim 17, wherein the third phase error signal is based at least in part on comparisons from a third edge sampler that compares a third input signal to the first threshold voltage.

19. The method of claim 15, wherein the respective at least two threshold voltages are configured to be compared to a 2-level pulse amplitude modulation (PAM-2) input signal.

20. The method of claim 15, wherein the respective at least two threshold voltages are configured to be compared to a 4-level pulse amplitude modulation (PAM-4) input signal.

* * * * *